United States Patent
Li et al.

(10) Patent No.: US 8,089,815 B2
(45) Date of Patent: Jan. 3, 2012

(54) PROGRAMMING MEMORY WITH BIT LINE FLOATING TO REDUCE CHANNEL-TO-FLOATING GATE COUPLING

(75) Inventors: Yan Li, Milpitas, CA (US); Anubhav Khandelwal, Mountain View, CA (US)

(73) Assignee: SanDisk Technologies Inc., Plano, TX (US)

( * ) Notice: Subject to any disclaimer, the term of this patent is extended or adjusted under 35 U.S.C. 154(b) by 275 days.

(21) Appl. No.: 12/624,584

(22) Filed: Nov. 24, 2009

(65) Prior Publication Data

US 2011/0122695 A1    May 26, 2011

(51) Int. Cl.
*G11C 16/04* (2006.01)
(52) U.S. Cl. ......... 365/185.26; 365/185.17; 365/185.19; 365/185.22; 365/185.28
(58) Field of Classification Search .............. 365/185.17, 365/185.19, 185.22, 185.26, 185.28
See application file for complete search history.

(56) References Cited

U.S. PATENT DOCUMENTS

| | | | |
|---|---|---|---|
| 6,956,770 | B2 | 10/2005 | Khalid |
| 7,064,980 | B2 | 6/2006 | Cernea |
| 7,206,235 | B1 | 4/2007 | Lutze |
| 7,215,574 | B2 | 5/2007 | Khalid |
| 7,242,616 | B2 | 7/2007 | Takeuchi |
| 7,313,023 | B2 | 12/2007 | Li |
| 7,400,534 | B2 | 7/2008 | Maejima |
| 7,447,079 | B2 | 11/2008 | Nguyen |
| 7,506,113 | B2 | 3/2009 | Li |
| 7,508,721 | B2 | 3/2009 | Li |
| 2005/0057965 | A1 | 3/2005 | Cernea et al. |
| 2006/0034140 | A1 | 2/2006 | Ogawa |
| 2006/0120165 | A1 | 6/2006 | Hemink |
| 2009/0059660 | A1 | 3/2009 | Lee |
| 2010/0002515 | A1* | 1/2010 | Lutze et al. .............. 365/185.17 |

FOREIGN PATENT DOCUMENTS

EP    1324343 A2    7/2003

OTHER PUBLICATIONS

U.S. Appl. No. 12/547,449, filed Aug. 25, 2009.
U.S. Appl. No. 12/624,595, filed Nov. 24, 2009.
U.S. Appl. No. 12/624,602, filed Nov. 24, 2009.
International Search Report & The Written Opinion of the International Searching Authority dated Jan. 24, 2011, Patent Cooperation Treaty, International Application No. PCT/US2010/057635 filed Nov. 22, 2010.

* cited by examiner

*Primary Examiner* — Hoai V Ho
(74) *Attorney, Agent, or Firm* — Vierra Magen Marcus & DeNiro LLP

(57) ABSTRACT

During programming of storage elements, channel-to-floating gate coupling effects are compensated to avoid increased programming speed and threshold voltage distribution widening. Programming speed can be adjusted by grounding the bit line of a selected storage element until it reaches a verify level which is below a target verify level of its target data state, after which the bit line is floated so that programming speed is slowed. The verify level which triggers the floating can be a target verify level of a data state that is one or more states below the target data state. Or, the verify level which triggers the floating can be an offset verify level of the target data state. An option is to raise the bit line voltage before it floats, to enter a slow programming mode, in which case there is a double slow down.

32 Claims, 21 Drawing Sheets

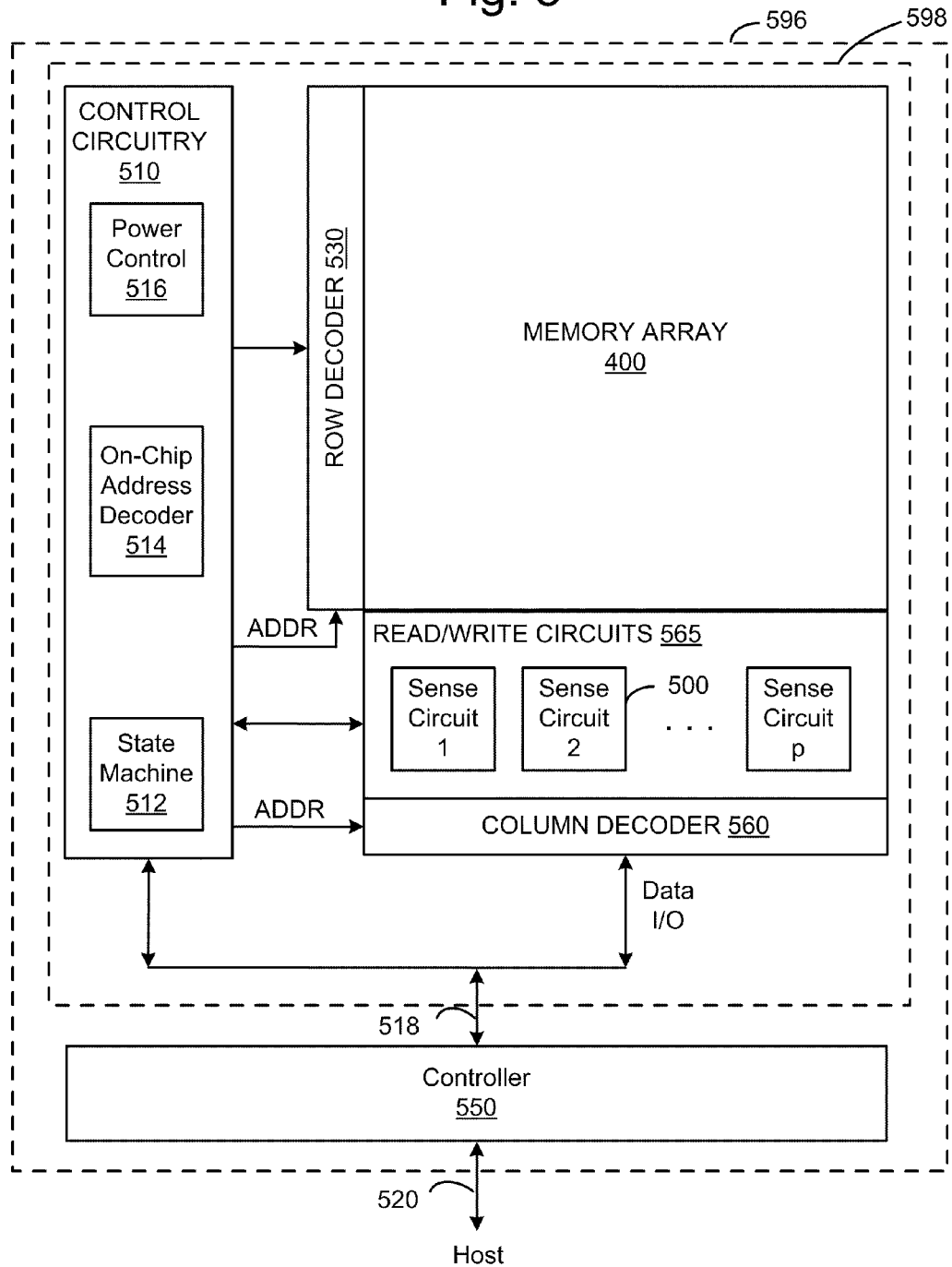

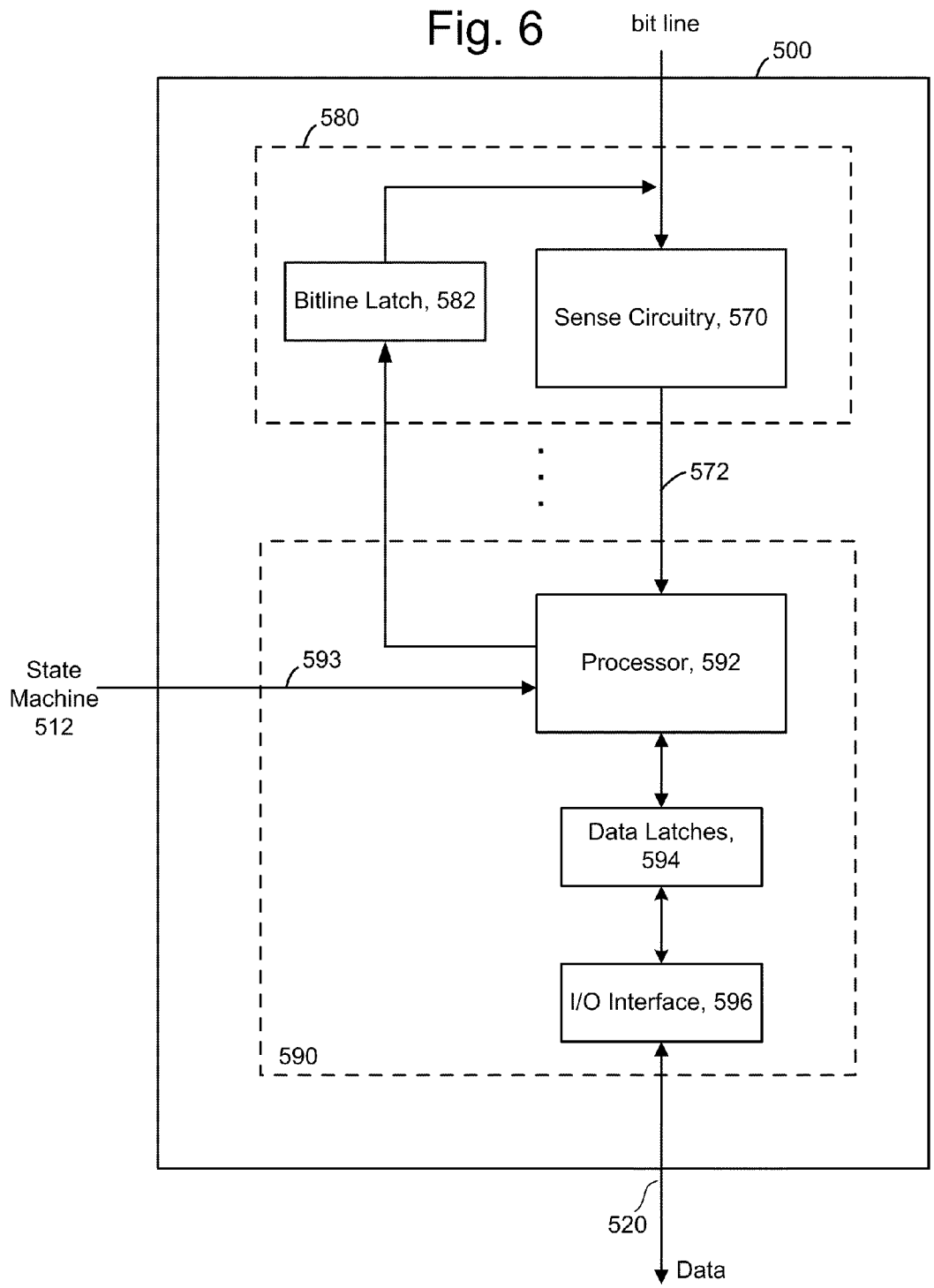

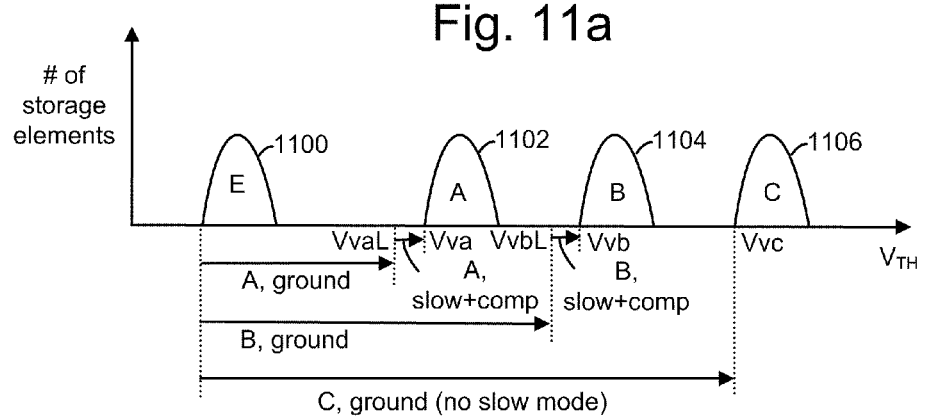
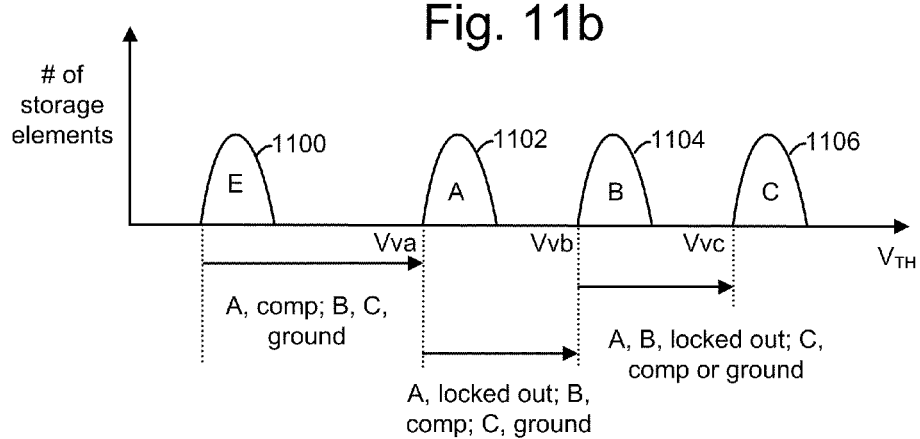

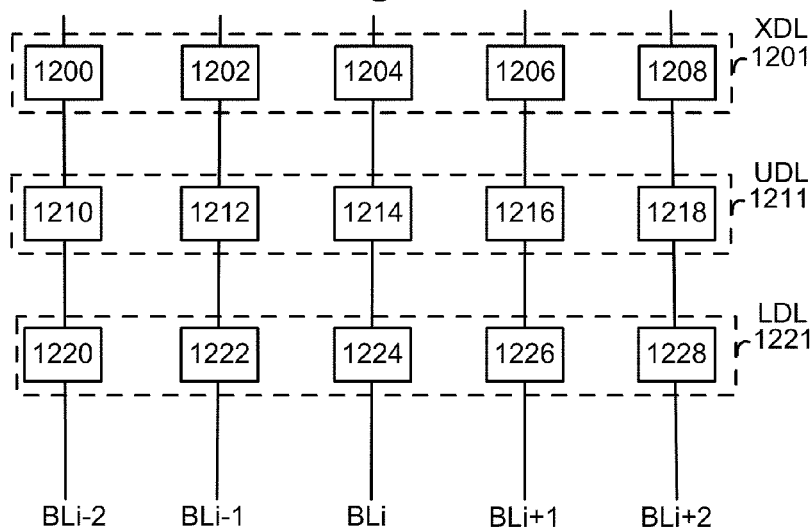
Fig. 11d
Fig. 11e
|  | E | Af | As | Ain | Bf | Bs | Bin | Cf | Cs | Cin |
|---|---|---|---|---|---|---|---|---|---|---|
| UDL | 0 | 0 | 1 | 0 | 0 | 1 | 0 | 0 | 1 | 1 |
| XDL | 1 | 0 | 0 | 1 | 0 | 0 | 1 | 1 | 1 | 1 |
| LDL | 1 | 1 | 1 | 1 | 0 | 0 | 1 | 0 | 0 | 1 |
| lockout | 1 | 0 | 0 | 1 | 0 | 0 | 1 | 0 | 0 | 1 |
| lockoutl | 1 | 0 | 1 | 1 | 0 | 1 | 1 | 0 | 1 | 1 |
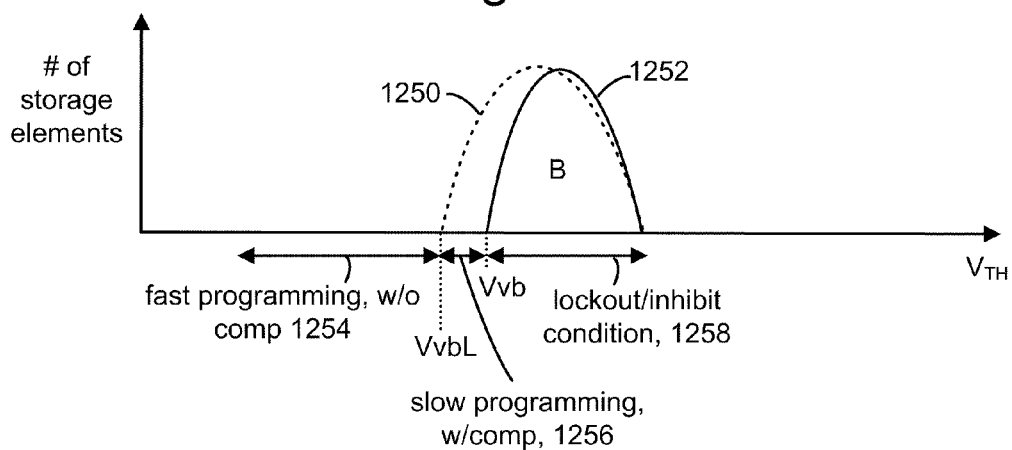
Fig. 12

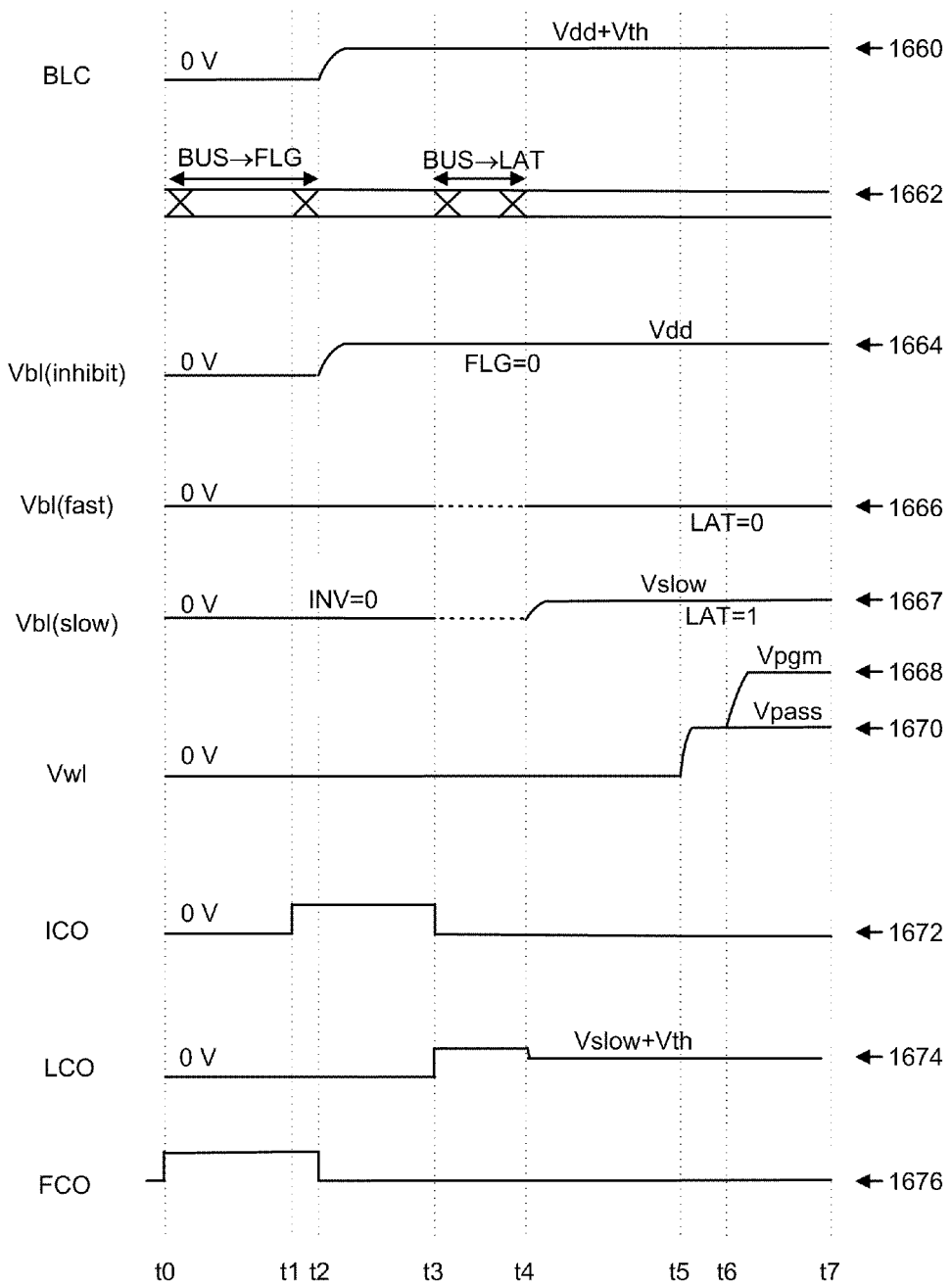

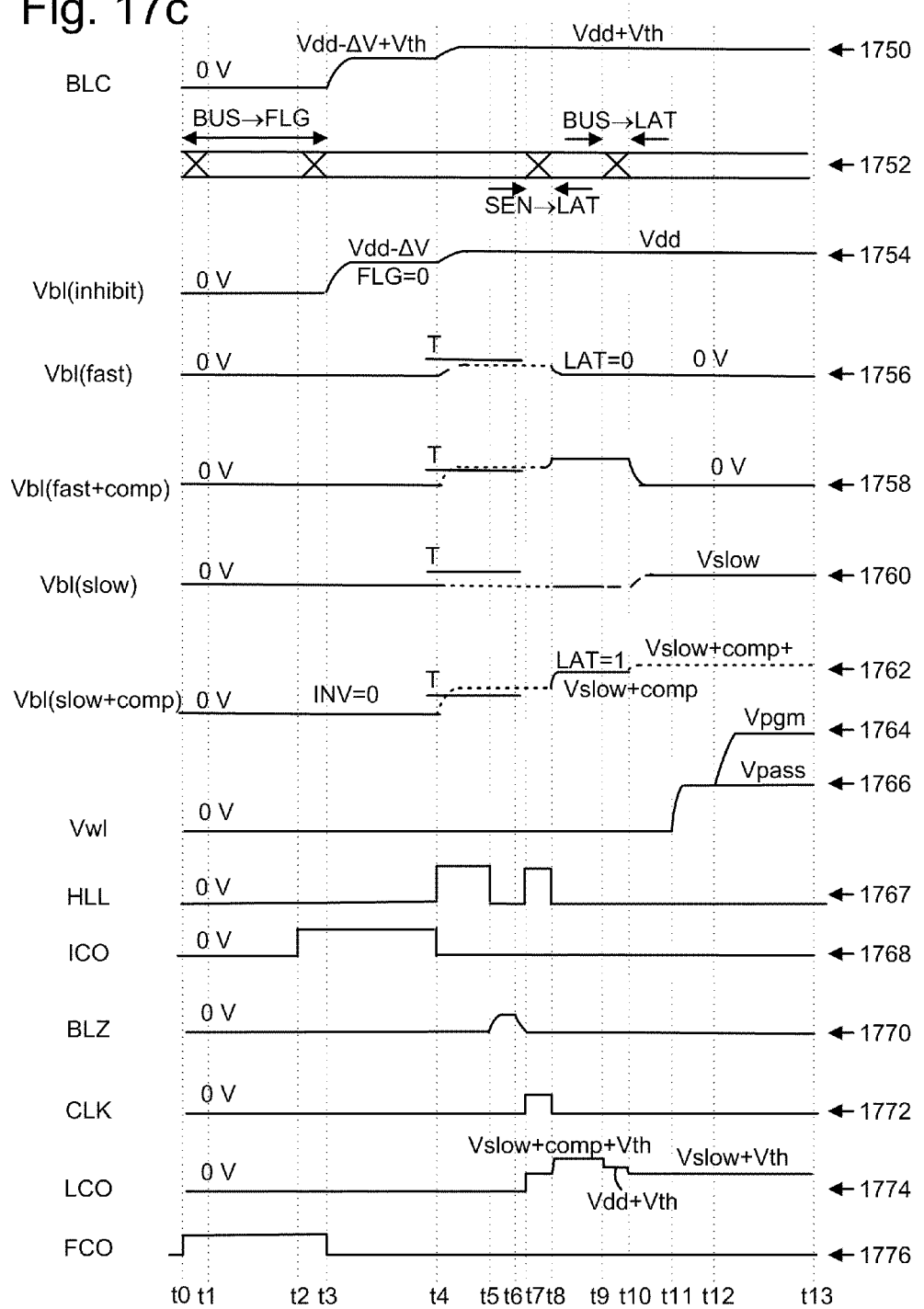

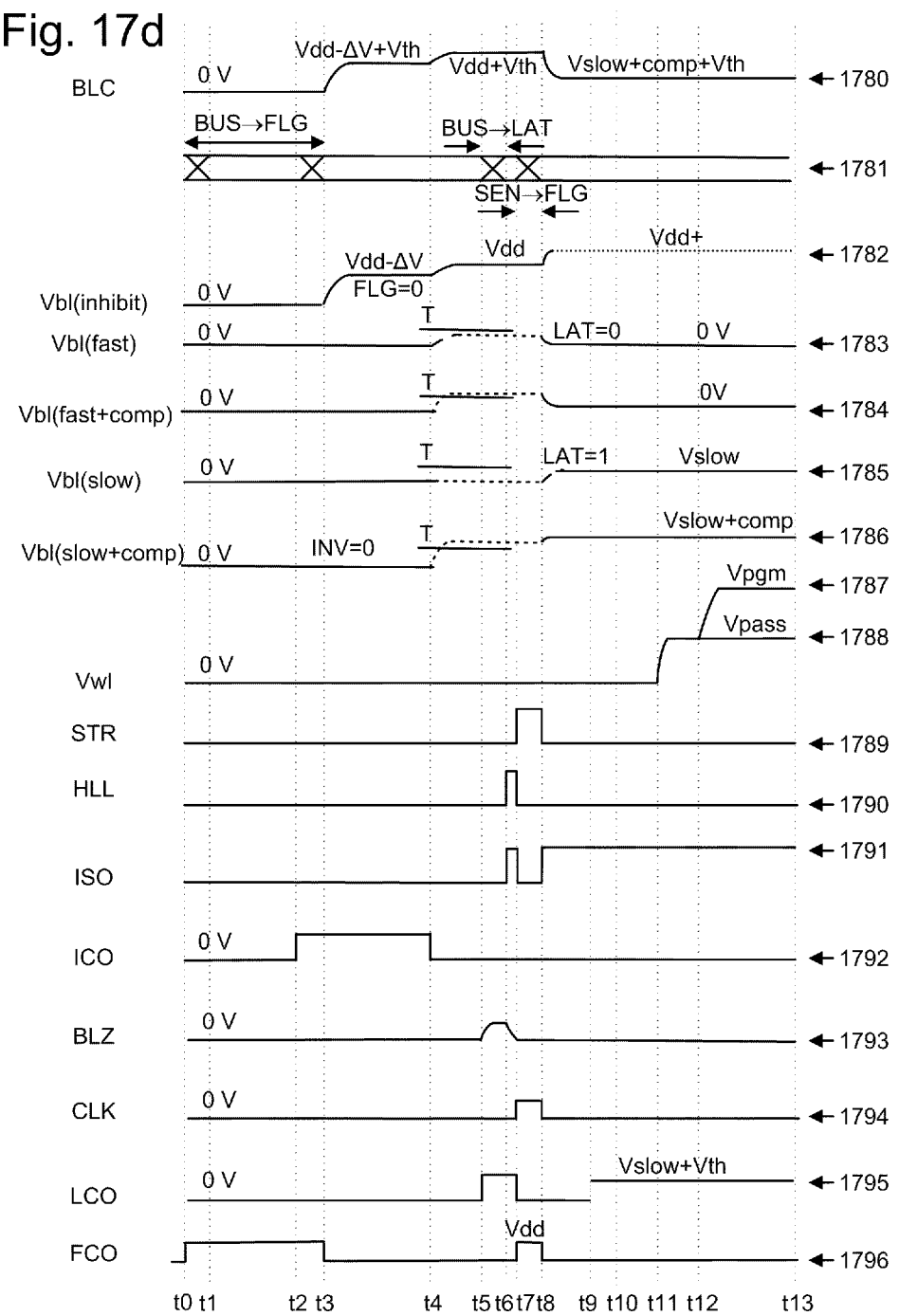

PROGRAMMING MEMORY WITH BIT LINE FLOATING TO REDUCE CHANNEL-TO-FLOATING GATE COUPLING

CROSS-REFERENCE TO RELATED APPLICATIONS

This application, is related to U.S. patent application Ser. No. 12/624,595, filed herewith, titled "Programming Memory With Sensing-Based Bit Line Compensation To Reduce Channel-To-Floating Gate Coupling," published as U.S. Ser. No. 2011/0122702 on May 26, 2011, and U.S. patent application Ser. No. 12/624,602, filed herewith, titled "Programming Memory With Direct Bit Line Driving To Reduce Channel-To-Floating Gate Coupling," published as U.S. Ser. No. 2011/0122703 on May 26, 2011 and issued as U.S. Pat. No. 7,986,573 on Jul. 26, 2011, both of which are incorporated herein by reference.

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage or pulse Vpgm applied to the control gate during a programming operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, as memory devices become smaller, capacitive coupling effects become more problematic during programming.

BRIEF DESCRIPTION OF THE DRAWINGS

FIG. 5 is a block diagram of a non-volatile memory system using single row/column decoders and read/write circuits.

FIG. 6 is a block diagram depicting one embodiment of a sense block.

FIG. 11a depicts an example programming technique which uses offset and target verify levels, and which reduces coupling effects.

FIG. 11b depicts an example programming technique which uses only one programming speed mode, and one verify level per state, and which reduces coupling effects.

FIG. 11d depicts data latches for respective bit lines.

FIG. 11e depicts bit assignments for the latches of FIG. 11d.

FIG. 12 depicts threshold voltage ranges of a data state for a fast programming mode with no compensation, a slow programming mode with compensation, and a lockout/inhibit condition.

FIG. 16b depicts a time line for programming which is associated with the sensing circuit of FIG. 16a.

FIG. 17b depicts a time line for sensing and programming which is associated with the sensing circuit of FIG. 16a.

FIG. 17c depicts a time line for sensing which is associated with the sensing circuit of FIG. 16a.

FIG. 17d depicts another time line for sensing which is associated with the sensing circuit of FIG. 16a.

FIG. 18b depicts a time line for sensing and programming which is associated with the sensing circuit of FIG. 18a.

DETAILED DESCRIPTION

Figure 1A:
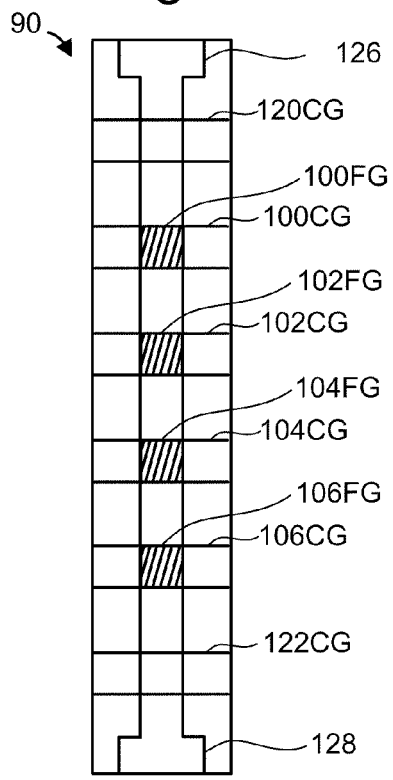
FIG. 1a is a top view of a NAND string.

A method and non-volatile storage system are provided in which coupling effects, including channel-to-floating gate capacitive coupling, are reduced during programming.

As memory devices become smaller, capacitive coupling effects become more problematic. In particular, during programming, storage elements which have completed programming (also referred to as unselected, locked out or inhibited storage elements) are inhibited by raising the channel potential of an associated substrate channel region via boosting with the help from all the word lines in the block and a floating channel. The floated channel is achieved by modulation from an increased bit line voltage (Vbl). However, this increased channel potential can couple to the floating gate of a nearby storage element (also referred to as a selected storage element) which is still being programmed, inadvertently raising the potential of the floating gate. This is referred to as channel-to-floating gate capacitive coupling. As a result, the programming speed can be increased beyond a desired level for selected storage elements, and their threshold voltage (Vth) distribution widened.

This increased programming speed can be experienced by storage elements which are in fast or slow programming modes, which are set by a control. Typically, Vbl of a selected bit line (associated with a selected storage element) is held at 0 V to provide the fast programming mode when the Vth of the storage element is far from a target Vth. Subsequently, the slow programming mode is used by raising Vbl to about 0.6-0.8 V to slow down, but not fully inhibit, programming, when the Vth of the storage element is close to the target Vth.

One approach to avoiding such coupling is to allow the bit lines to float for the selected storage element. However this does not allow the slow programming mode to be used, where the Vbl needs to be at a specified non-zero level. Various solutions provided herein provide sensing circuits and programming techniques which drive and/or float bit lines in an optimal way.

In one approach, a programming slow down is provided without the need for additional verify operations and control-implemented fast or slow programming modes. Instead, the target verify level of one state can be used to slow programming for a selected storage element which is being programmed to a next higher state by floating the bit line of the selected storage element. The channel potential, which is the Vbl passing through to the channel, increases due to coupling from the stepping up of unselected neighbor bit lines (associated with unselected storage elements), thereby slowing the programming speed. This approach automatically and adaptively provides more slowing when there is more bit line-to-bit line coupling, and acts as a countermeasure to the channel potential increase due to channel-to-floating gate coupling.

In another approach, channel-to-floating gate capacitive coupling is compensated for in a selected storage element which is in a slow programming mode. In this approach, unselected bit lines are driven with a voltage step up which couples to selected bit lines and is transferred to the associated channels. The channel potential determined by the Vbl could be in the range of 0.8 to 1.2 V, which is higher than their previous bit line bias, thereby compensating for the higher floating gate potential of the selected storage element. As a result, the slow programming mode is carried out for the selected storage elements at the intended slow speed, without any speed up which would otherwise be experienced without such compensation. A similar compensation can be provided for a selected storage element in a fast programming mode, where its channel is initially grounded, then biased due to bit line coupling, so that programming is carried out at the intended fast speed, without any speed up which would otherwise be experienced without such compensation. Although, compensation for selected storage elements which are in a fast programming mode is generally less critical than for slow programming mode storage elements. A variation of this and other approaches relates to the timing of passing Vbl to the channel relative to when the pass voltages are applied to the word lines. The timing for adjusting a drain select gate voltage can also be optimized.

In another approach, as part of a programming operation, a sensing operation is performed to determine whether a selected storage element (and its bit line, referred to as a selected bit line) is adjacent to one or more unselected storage elements (and their bit lines, referred to as unselected bit lines). An unselected bit line is a bit line associated with an unselected storage element on a selected word line. A selected bit line is a bit line associated with a selected storage element on a selected word line. Channel-to-floating gate coupling, from the channel of an unselected storage element to the floating gate of a selected storage element on the same word line, is strongest when the selected storage element is adjacent to one or two unselected storage elements which undergo channel boosting. Sensing can be used to determine when this situation is present, to provide appropriate compensation when it is needed, and to not provide compensation when it is not needed.

In another approach, a compensation voltage alone, or in combination with a slow programming mode bias, is provided directly to the channel of a selected storage element via its bit line.

Figure 1B:
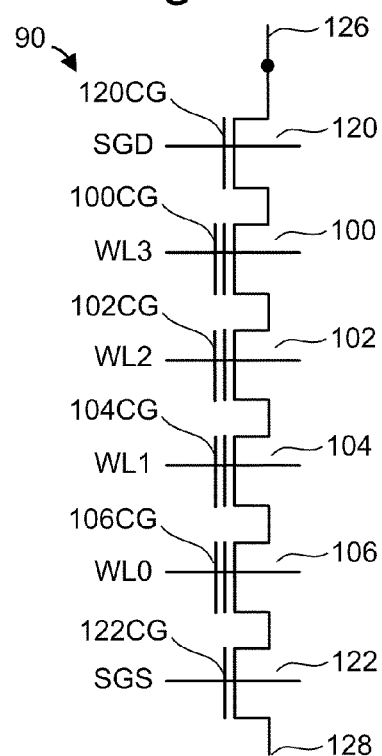
FIG. 1b is an equivalent circuit diagram of the NAND string.

One example of a suitable memory system uses the NAND flash memory structure, which arranges multiple transistors in series between two select gates. The transistors in series and the select gates are referred to as a NAND string. FIG. 1a is a top view showing one NAND string 90. FIG. 1b is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one embodiment, transistors 100, 102, 104 and 106 are each memory cells. In other embodiments, the memory cells may include multiple transistors or may be different than that depicted. Select gates 120 and 122 are connected to drain-side select line SGD and source-side select line SGS, respectively.

Figure 2:
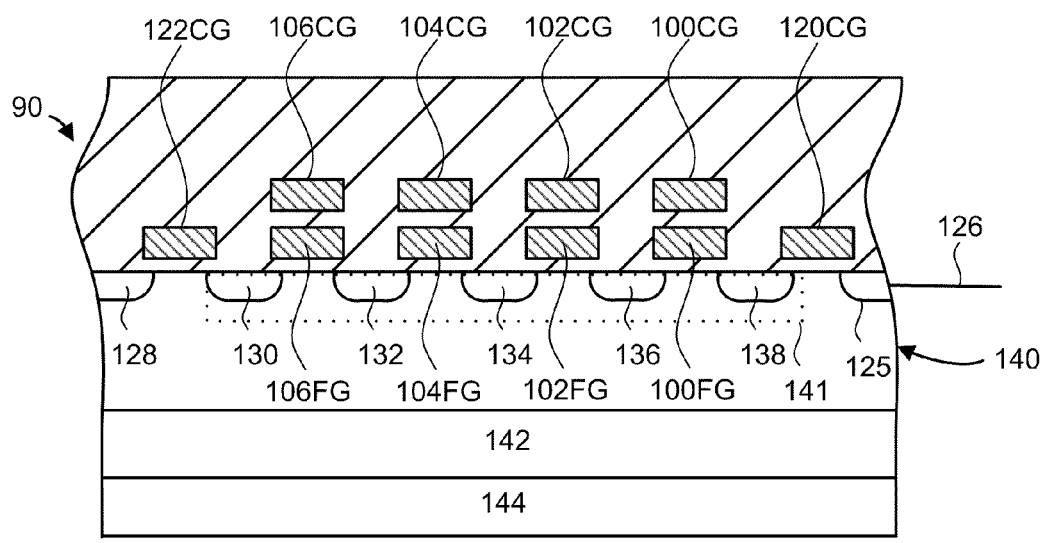
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers or regions 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 125 connects to the bit line 126 for the NAND string, while N+ doped layer 128 connects to a common source line for multiple NAND strings. Each memory cell can store data represented in analog or digital form, in one or more bits.

Other types of non-volatile memory in addition to NAND flash memory can also be used.

As part of a programming operation, the potential of a channel region of the substrate which is associated with an unselected storage element and, e.g., an unselected NAND string 90, can be boosted. An unselected storage element or NAND string may be referred to as an inhibited or locked out storage element or NAND string as it is inhibited or locked out from programming in a given programming iteration of a programming operation. For example, channel region 141 may be provided in the p-well 140 of the substrate 144 when any of the storage elements which are provided by control gates and floating gates 100CG/100FG, 102CG/100FG, 104CG/104FG and 106CG/106FG is an unselected storage element in a programming operation, e.g., when the NAND string 90 is an unselected NAND string. The channel region 141 represents a conductive path in the substrate, extending in and between the doped regions 130, 132, 134, 136 and 138. Boosting can be achieved in different ways. For example, in a pre-charge operation, which occurs before a pass voltage is applied to an unselected word line, a voltage supplied on the bit line 126 can be passed to the channel 141 via the drain-side select gate transistor 120CG.

In one possible scenario, with an appropriate Vbl, the drain-side select gate transistor provides a voltage of Vbl to the channel, as a pre-charge voltage, as the control gate of the drain-side transistor is biased at Vdd+Vth where Vdd is the supply voltage to the sensing circuits and Vth is the threshold voltage of the drain-side select gate transistor. As the control gate voltage rises, the channel is boosted to a higher potential. The drain-side select gate transistor may subsequently be rendered non-conductive so that the bit line is cutoff from the channel 141, and the boosted potential is maintained in the channel. Channel boosting can also be achieved by applying pass voltages to the word lines and floating the channel. The pass voltages couple to the channel, raising its potential.

Figure 3:
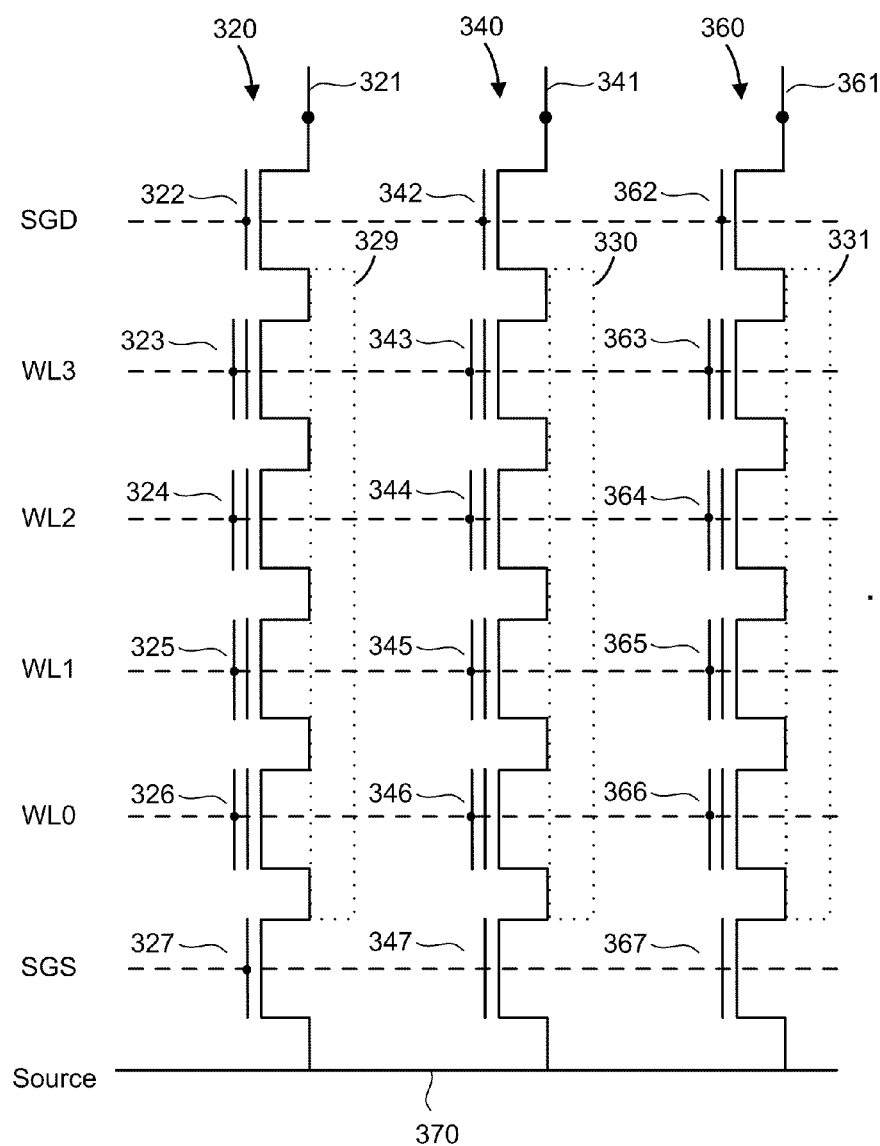
FIG. 3 is a circuit diagram depicting three NAND strings.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line 370 by its select gates (e.g., select gates 327, 347 or 367). A selection line SGS is used to control the source side select gates. The various NAND strings 320, 340 and 360 are connected to respective bit lines 321, 341 and 361, by drain-side select transistors in the select gates 322, 342, 362, respectively. These select transistors are controlled by a drain select line SGD. In other embodiments, the select lines do not necessarily need to be in common among the NAND strings; that is, different select lines can be provided for different NAND strings. Example channel regions 329, 330 and 331 which are associated with the NAND strings 320, 340 and 360, respectively, may be created in the substrate. Note that the storage elements and channel regions are depicted as if they were rotated 90 degrees from their actual position.

Word lines are connected to the control gates for storage elements as follows: WL3 (storage elements 323, 343 and 363), WL2 (storage elements 324, 344 and 364), WL1 (storage elements 325, 345 and 365), and WL0 (storage elements 326, 346 and 366). Each word line connects the control gates of each storage element in the row. Or, the control gates may be provided by the word lines themselves.

When programming a flash storage element, a program voltage is applied to the control gate of the storage element, e.g., via an associated word line, and the bit line associated with the storage element is grounded. Electrons from the channel are injected into the floating gate. When electrons accumulate in the floating gate, the floating gate becomes negatively charged and the Vth of the storage element is raised.

Figure 4:
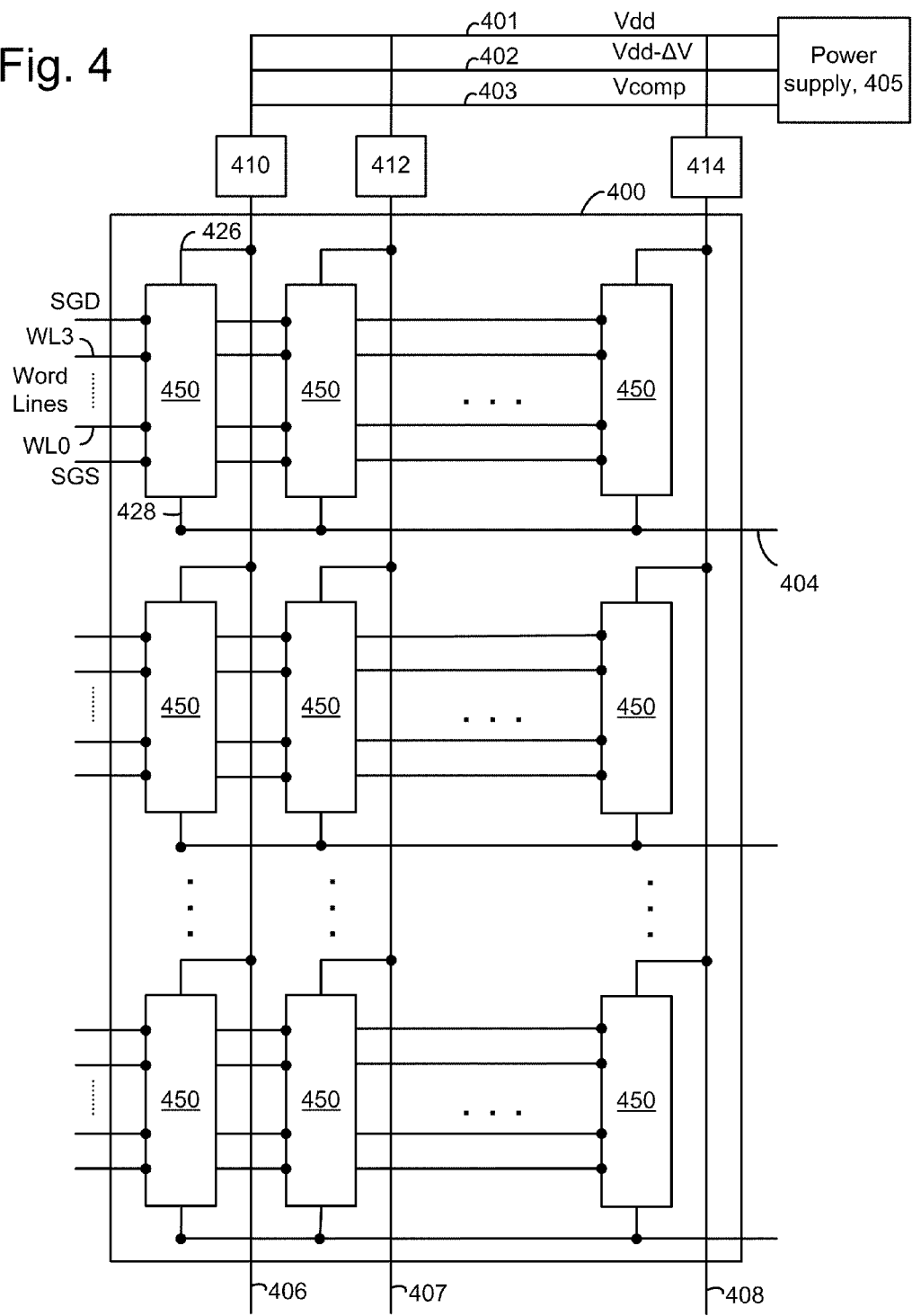
FIG. 4 is a block diagram of an array of NAND flash storage elements.

FIG. 4 illustrates an example of an array 400 of NAND storage elements, such as those shown in FIGS. 1a and 1b. Along each column, a bit line 406 is coupled to the drain terminal 426 of the drain-side select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. A large number of pages form a block, anywhere from 8 pages, for example, up to 32, 64, 128 or more pages. In some embodiments, a row of NAND strings comprises a block.

Example sense circuits 410, 412, 414 communicate with bit lines 406, 407 and 408, respectively. The sense circuits are in communication with power supply lines 401, 402 and 403 at Vdd, Vdd−ΔV and Vcomp, respectively, which are provided by one or more power supplies 405. These voltages are described further below. The sense circuits also communicate with one or more control circuits to exchange control signals and data.

FIG. 5 is a block diagram of a non-volatile memory system using single row/column decoders and read/write circuits. A memory device 596 having read/write circuits for reading and programming a page of storage elements in parallel, according to one embodiment. Memory device 596 may include one or more memory die 598. Memory die 598 includes a two-dimensional array of storage elements 400, control circuitry 510, and read/write circuits 565. In some embodiments, the array of storage elements can be three dimensional. The memory array 400 is addressable by word lines via a row decoder 530 and by bit lines via a column decoder 560. The read/write circuits 565 include multiple sense blocks 500 (typically, each sense block includes a set of sense circuits or sense amplifiers, one for each bit line) and allow a page of storage elements to be read or programmed in parallel. Example sense circuits are described is further detail below. Typically a controller 550 is included in the same memory device 596 (e.g., a removable storage card) as the one or more memory die 598. Commands and data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations, and may include the power supply 405 of FIG. 4.

In some implementations, some of the components of FIG. 5 can be combined. In various designs, one or more of the components (alone or in combination), other than storage element array 400, can be thought of as a managing or control circuit. For example, one or more managing or control circuits may include any one of or a combination of control circuitry 510, state machine 512, decoders 514/560, power control module 516, sense blocks 500 (comprising sense circuits, discussed further below), read/write circuits 565, controller 550, and so forth.

In another embodiment, a non-volatile memory system uses dual row/column decoders and read/write circuits. Access to the memory array 400 by the various peripheral circuits is implemented in a symmetric fashion, on opposite sides of the array.

FIG. 6 is a block diagram depicting one embodiment of a sense block. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580, each analogous to the sense circuits discussed further below. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit.

Common portion 590 comprises a processor 592, a set of data latches 594 and an I/O Interface 596 coupled between the set of data latches 594 and data bus 520. Processor 592 performs computations. For example, one of its functions is to determine the data stored in the sensed storage element and store the determined data in the set of data latches. The set of data latches 594 is used to store data bits determined by processor 592 during a read operation. It is also used to store data bits imported from the data bus 520 during a programming operation. The imported data bits represent write data meant to be programmed into the memory. I/O interface 596 provides an interface between data latches 594 and the data bus 520.

During reading or other sensing, a state machine 512 controls the supply of different control gate voltages to the addressed storage element. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During program or verify, the data to be programmed is stored in the set of data latches 594 from the data bus 520. The programming operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 7A:
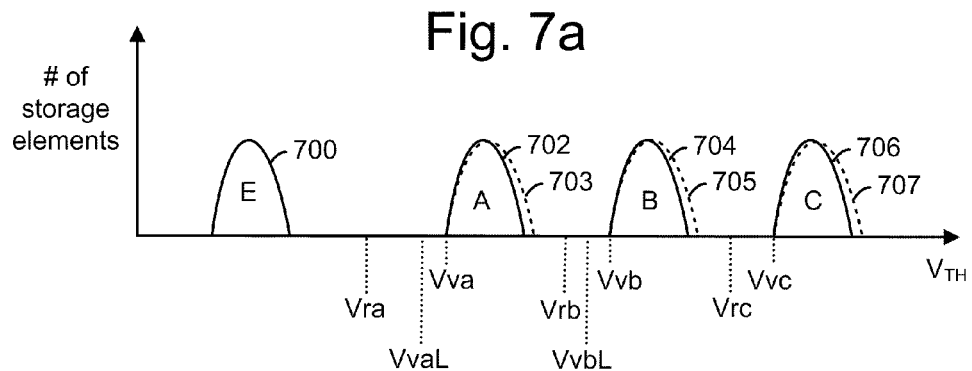
FIG. 7a depicts an example set of threshold voltage distributions, including widened distributions which are due to coupling effects.

FIG. 7a depicts an example set of threshold voltage distributions for a four-state memory device in which each storage element stores two bits of data. A first Vth distribution 700 is provided for erased (E-state) storage elements. Three Vth distributions 702, 704 and 706 represent programmed states A, B and C, respectively, in which channel-to-floating gate coupling is compensated. Widened Vth distributions 703, 705 and 707 occur for programmed states A, B and C, respectively, due to channel-to-floating gate coupling. Such coupling increases the potential on the floating gate of a selected storage element so that its programming speed, e.g., represented as a change in Vth per program pulse, is sped up above an intended programming speed, resulting in widening of the Vth distributions on the upper tail end. In one embodiment, the threshold voltages in the E-state are negative, and the threshold voltages in the A-, B- and C-states are positive.

Read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 8:
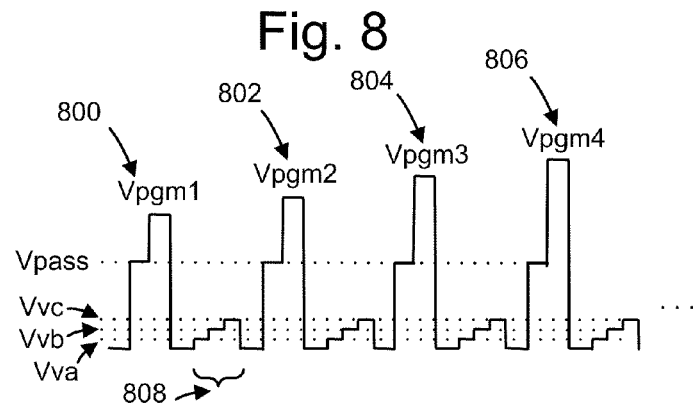
FIG. 8 depicts a series of program and verify pulses which are applied to a selected word line during a programming operation.

In full sequence programming, storage elements can be programmed from the E-state directly to any of the programmed states A, B or C. For example, a population of storage elements to be programmed may first be erased so that all storage elements in the population are in the E-state. A series of program pulses such as depicted in FIG. 8 is used to program storage elements directly into the A-, B- and C-states. While some storage elements are being programmed from the E-state to the A-state, other storage elements are being programmed from the E-state to the B-state and/or from the E-state to the C-state.

One example of a slow programming mode uses low (offset) and high (target) verify levels for one or more data states. For example, VvaL and Vva are offset and target verify levels, respectively, for the A-state, and VvbL and Vvb are offset and target verify levels, respectively, for the B-state. During programming, when the Vth of a storage element which is being programmed to the A-state as a target state (e.g., an A-state storage element) exceeds VvaL, its programming speed is slowed, such as by raising Vbl to a level, e.g., 0.6-0.8 V, which is between a nominal program or non-inhibit level, e.g., 0 V and a full inhibit level, e.g., 2-3 V. This provides greater accuracy by avoiding large step increases in Vth. When the Vth reaches Vva, the storage element is locked out from further programming. Similarly, when the Vth of a B-state storage element exceeds VvbL, its programming speed is slowed, and when the Vth reaches Vvb, the storage element is locked out from further programming. In one approach, a slow programming mode is not used for the highest state since some overshoot is typically acceptable. Instead, the slow programming mode can be used for the programmed states, above the erased state, and below the highest state.

Figure 7B:
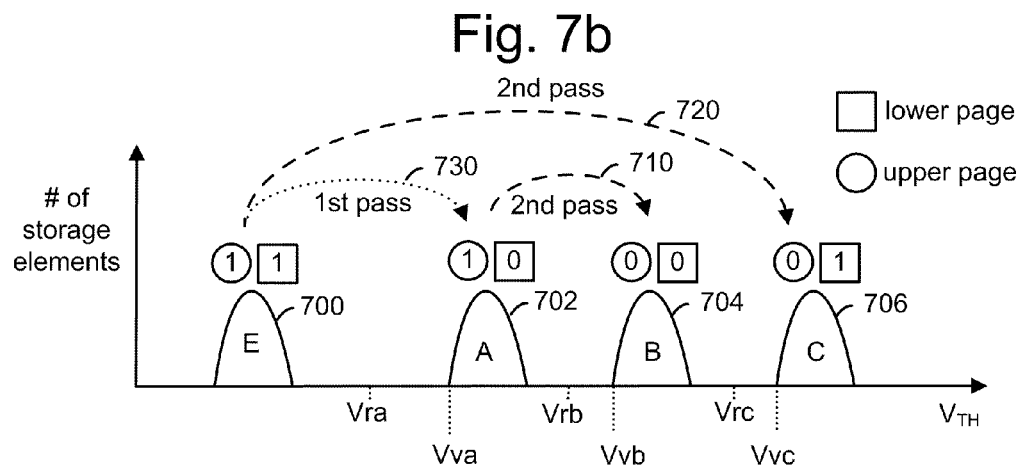
FIG. 7b depicts an example set of threshold voltage distributions and two-pass programming.

FIG. 7b illustrates an example of a two-pass technique of programming a multi-state storage element that stores data for two different pages: a lower page and an upper page. Four states are depicted by repeating the threshold voltage distributions 700, 702, 704 and 706 from FIG. 7a. These states, and the bits they represent, are: E-state (11), A-state (10), B-state (00) and C-state (01). For E-state, both pages store a "1." For A-state, the lower page stores a "0" and the upper page stores a "1." For B-state, both pages store "0." For C-state, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be A-state, as shown by arrow 730. That concludes the first programming pass.

In a second programming pass, the storage element's Vth is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the Vth is shifted. If the first pass resulted in the storage element remaining in the E-state, then in the second phase the storage element is programmed so that the Vth is increased to be within C-state, as depicted by arrow 720. If the storage element had been programmed into A-state as a result of the first programming pass, then the storage element is further programmed in the second pass so that the Vth is increased to be within B-state, as depicted by arrow 710. The result of the second pass is to program the storage element into the state designated to store a logic "0" for the upper page without changing the data for the lower page.

Note that a slow programming mode can also be used with this technique.

In one approach, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements.

In another possible programming technique, in a first step, the lower page is programmed. If the lower page is to remain data 1, then the storage element state remains at E-state. If the data is to be programmed to 0, then the threshold of voltage of the storage element is raised such that the storage element is programmed to an intermediate distribution which extends between states A and B.

In programming the upper page, if the storage element is in the E-state and the upper page is to remain at 1, then the storage element will remain in E-state. If the storage element is in E-state and its upper page data is to be programmed to 0, then the threshold voltage of the storage element will be raised so that the storage element is in A-state. If the storage element was in the intermediate Vth distribution and the upper page data is to remain at 1, then the storage element will be programmed to target B-state. If the storage element is in the intermediate Vth distribution and the upper page data is to become data 0, then the threshold voltage of the storage element will be raised so that the storage element is in C-state.

Although the programming examples depict four data states and two pages of data, the concepts taught can be applied to other implementations with more or fewer than four states and more or fewer than two pages. For example, memory devices with eight or sixteen states per storage element are currently planned or in production.

Moreover, in the example programming techniques discussed, the Vth of a storage element is raised as it is programmed to a target data state. However, programming techniques can be used in which the Vth of a storage element is lowered as it is programmed to a target data state. Programming techniques which measure storage element current can be used as well. The concepts herein can be adapted to different programming techniques.

FIG. 8 depicts a series of program and verify pulses which are applied to a selected word line during a programming operation. A programming operation may include multiple programming iterations, where each iteration applies one or more program pulses (voltages) followed by one or more verify voltages, to a selected word line. In one possible approach, the program voltages are stepped up in successive iterations. Moreover, the program voltages may include a first portion which has a pass voltage (Vpass) level, e.g., 6-8 V, followed by a second portion at a program level, e.g., 12-25 V. For example, first, second, third and fourth program pulses 800, 802, 804 and 806 have program voltages of Vpgm1, Vpgm2, a Vpgm3 and Vpgm4, respectively, and so forth. A set 808 of one or more verify voltages, such as Vva, Vvb and Vvc, may be provided after each program pulse. In some cases, one or more initial program pulses are not followed by verify pulses because it is not expected that any storage elements have reached the lowest program state (e.g., A-state). Subsequently, program iterations may use verify pulses for the A-state, followed by program iterations which use verify pulses for the A- and B-states, followed by program iterations which use verify pulses for the B- and C-states, for instance.

In one option, even-odd program pulses are used. In this case, in a single program iteration, one program pulse is used to program selected storage elements of even-numbered bit lines, followed by another program pulse to program selected storage elements of odd-numbered bit lines, followed by one or more verify pulses for both the even- and odd-numbered bit lines.

Figure 9:
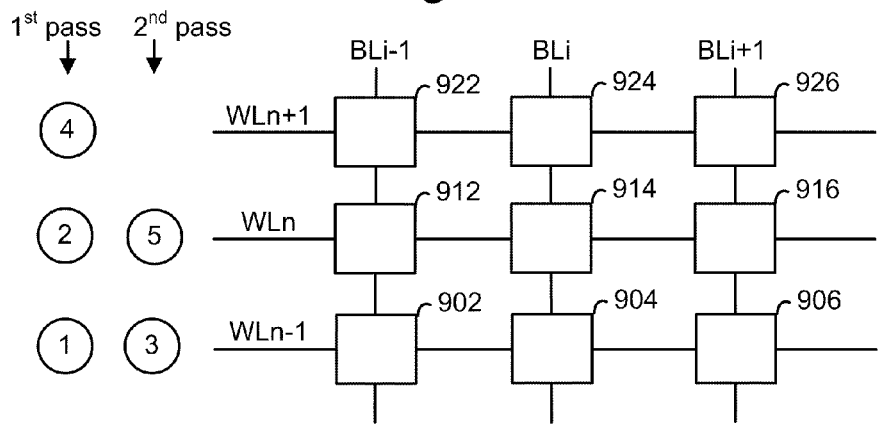
FIG. 9 depicts a multi-pass programming operation for a set of storage elements.

FIG. 9 depicts a multi-pass programming operation for a set of storage elements. The components depicted may be a subset of a much larger set of storage elements, word lines and bit lines. In one approach, storage elements on WLn−1, e.g., storage elements 902, 904 and 906, are programmed in a first programming pass. This step is represented by the circled "1." Next ("2"), storage elements on WLn, e.g., storage elements 912, 914 and 916, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next ("3"), storage elements on WLn−1 are programmed in a second programming pass. Next ("4"), storage elements on WLn+1 are programmed in a first programming pass. Next ("5"), the storage elements on WLn are programmed in a second programming pass to their respective target states.

Figure 10A:
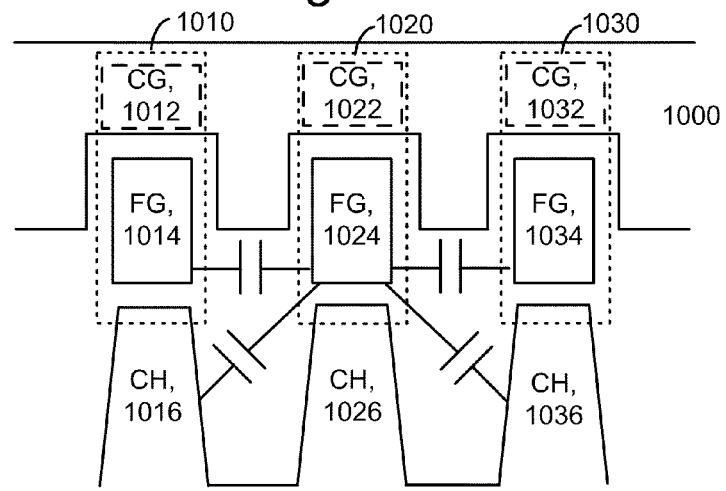
FIG. 10a depicts a cross-sectional view of NAND strings showing channel-to-floating gate coupling and floating gate-to-floating gate coupling.

FIG. 10*a* depicts a cross-sectional view of NAND strings showing channel-to-floating gate coupling and floating gate-to-floating gate coupling. A bit line or NAND string direction goes into the page, and a word line direction goes from left to right. A word line 1000 extends across multiple NAND strings. A first NAND string includes a channel region (CH) 1016. See also the channel regions discussed in connection with FIGS. 2 and 3. A storage element 1010 in the first NAND string includes a control gate (CG) 1012, which is a portion of the word line 1000, and a floating gate (FG) 1014. A second NAND string includes a channel region 1026. A storage element 1020 in the second NAND string includes a control gate 1022, which is a portion of the word line 1000, and a floating gate 1024. A third NAND string includes a channel region 1036. A storage element 1030 in the third NAND string includes a control gate 1032, which is a portion of the word line 1000, and a floating gate 1034.

As memory devices are scaled down, storage element-to-storage element interferences play an increasingly important role. As mentioned at the outset, one of these interferences is channel-to-floating gate coupling which occurs during programming. In all-bit line programming, consider a selected storage element 1020 of a selected word line 1000 which undergoes programming. When an adjacent storage element (e.g., 1010 and/or 1030) of an adjacent bit line, on the same word line 1000, reaches its target data state, it is locked out from further programming. As a result, in the next program iteration, a substrate channel region (e.g., 1016 and/or 1036) of the locked out or unselected storage element is boosted to prevent the floating gate (e.g., 1014 and/or 1034) of the unselected storage element from being increased when a program pulse is applied to the selected word line 1000. However, the boosted potential in the channel (e.g., 1016 and/or 1036) couples up to the floating gate 1024 of the selected storage element 1020, if the channel 1026 is kept at a fixed voltage such as 0 V, leading to an increase in the effective electric field between the floating gate 1024 and the channel 1026 when a program pulse is applied. The amount of coupling depends on the channel potential and coupling coefficients. This results in a larger jump in the Vth of the selected storage element than is desired. The Vth distributions of the storage elements are therefore widened undesirably, as shown in FIG. 7*a*.

In addition to channel-to-floating gate coupling, floating gate-to-floating gate coupling can also increase the effective Vpgm which is seen by a selected storage element. This is represented by coupling from floating gates 1014 and/or 1034 to floating gate 1024.

For example, if a program voltage with a step size of 0.2 V is applied to the word line 1000, due to the coupling from the channel 1016, the potential of the floating gate 1024 may increase by an amount which would be expected if the step size was higher, such as 0.3 V, and there was no coupling from the channel 1016. Coupling from the channel 1036 can similarly inadvertently increase the potential of the floating gate 1024 so that it is programmed faster than expected. This is mainly a concern in an all bit line (ABL) programming technique where adjacent bit lines/NAND strings are concurrently programmed. With ABL, a neighbor storage element can be a programming storage element with a channel at 0 V at the beginning of programming. As programming proceeds, the neighbor storage element is changed to be an inhibited storage element with a boosted channel voltage as high as, e.g., 8 V. This sudden change could cause neighbor storage elements to experience a sudden increase in the electric field for programming.

One characteristic of ABL programming is that the program finish points can be quite random and unpredictable. In the even/odd program technique, discussed above, the odd-numbered NAND chains are unselected when the even-numbered NAND chains are programmed, and vice-versa. The unselected NAND channel is always boosted at a high potential from the beginning of the program sequence. Channel-to-floating gate coupling effectively makes the selected storage elements see a higher electric field for programming, but the selected storage elements are only programmed faster in the first program pulse in which the higher field is seen. The subsequent program pulses are not affected by the constant coupling from the unselected neighbor channels and therefore there would be no sudden Vth change for the selected storage elements following a steady state programming. Even though the even/odd program technique has the advantage of no channel-to-floating gate coupling side effects, its performance is only half that of ABL programming. Therefore, it is worth while to have compensation technique for ABL programming without a performance penalty.

With ABL programming, to overcome the sudden electric field change on the selected storage element, the channel of the selected storage element can be compensated with a certain voltage, e.g. 0.5 V, to reduce the effective voltage across floating gate to the channel. This channel bias can be supplied through the bit line through the selected gate SGD, as shown in FIG. 3. The voltage on the bit line 341 can be passed to the channel 330 by raising the gate voltage 342 to an appropriate level. The bit line-to-bit line coupling is relatively strong as the bit lines are very close to each other. This fact can be utilized to obtain the bit line potential needed to modulate the channel potentials.

Figure 10B:
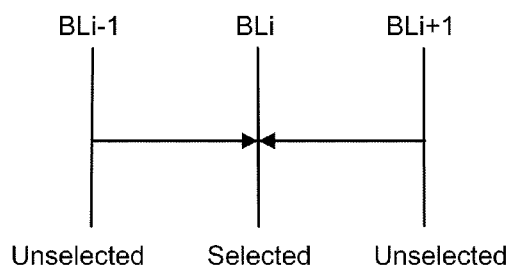
FIG. 10b depicts coupling from unselected bit lines to a selected bit line.

FIG. 10b depicts coupling from unselected bit lines to a selected bit line. Coupling represented by the arrows can occur from unselected bit lines to selected bit lines. Such coupling is highest when both adjacent unselected bit lines couple to a selected bit line. This bit line coupling can be used to compensate and control the channel voltages of the selected storage elements.

Generally, the coupling which is experienced by a selected bit line depends on a pattern of one or more neighboring bit lines. For example, coupling can be experienced from one or more non-adjacent bit lines. It is also possible for coupling effects to be transferred across a chain of bit lines, in a ripple effect. Consider a series of adjacent bit lines with the pattern: U1-S2-S3-S4-U5, where U and S represent unselected and selected bit lines, respectively. For S3, coupling can be received from U1 and U5 even though they are non-adjacent bit lines. The coupling ratio between adjacent bit lines can be relatively high, e.g., 45%; another 5% is from the next-next neighbor coupling or ground. The coupling from a bit line which is two bit lines away from another bit line is 45%× 45%=20.25%, which is significant. Thus, S3 could receive 40.5% of the coupling in total, which is very close to the case where a selected storage element has an adjacent unselected neighbor on one side. There are intended and un-intended coupling effects. The coupling from U5 to S4 or from U1 to S1 are the intended couplings which will provide a slow down effect to compensate the channel coupling effects from U5 to S4 and from U1 to S1. The S3 bit line coupling from both U1 and U5 (e.g., 40.5%) is very close to 45% direct coupling effect, and is an unintended coupling effect and leads to an undesirable programming slow down. S3 is not affected by coupling from its direct neighbors, i.e. S2 and S4, because they do not have the inhibited channels to couple up the floating gate of the selected storage element associated with S3.

Various approaches to reducing channel-to-floating gate coupling include the use of even-odd program pulses, discussed above. However, this results in a performance penalty. It is also possible to provide less boosting for the unselected storage elements, but this increase the risk of program disturb. A floated bit line technique with the slow programming mode is also possible, but is difficult to implement effectively. The inhibit bit line which is floated in such an implementation can be coupled by the slow programming mode bit line (a bit line associated with a slow programming mode selected storage element), and the final step up in the inhibited Vbl may not be sufficient to couple up the slow programming mode bit line to sufficiently slow down the program. Another approach is the use of a smaller program pulse step size. However, this also results in a performance penalty.

FIG. 11a depicts threshold voltage distributions 1100, 1102, 1104 and 1106 in an example programming technique which uses offset and target verify levels, and which reduces coupling effects.

In one approach, A- and B-state storage elements are first programmed in a fast programming mode and then in a slow programming mode, as their Vth approaches respective target verify levels. C-state storage elements do not have slow down to enhance performance. As discussed in connection with FIG. 7a, slow and fast programming modes can be used to achieve tighter Vth distributions. A storage element can be initially programmed from the erased state to a higher state in the fast programming mode in which its bit line is at 0 V. Since the storage element is far from its target verify level, coupling effects can be ignored because the sudden Vth jump caused by the coupling can not over-program the storage element beyond the desired Vth range. When the Vth of the storage element passes an offset verify level such as VvaL or VvbL, which is offset from the target verify level Vva or Vvb, respectively, the storage element enters a slow programming mode in which the rate of increase of Vth with each program pulse is reduced, such as by raising Vbl to, e.g., Vslow=0.6-0.8 V. When the storage element is in the slow programming mode, and therefore close to its target verify level, coupling effects should be compensated since precise control is desired. An extra slow down is needed on top of the intended slow down to compensate channel coupling effects. This technique can be called a double slow down (DSD). One approach to providing an additional slow down is to float the bit line after raising Vbl to Vslow. When the Vth of the storage element passes the target verify level, the storage element is locked out from further programming by raising its Vbl.

In some situations, the final program technique with an intended slow down when approaching the target may not be necessary.

Another approach uses one programming speed mode, but still performs verify operations at the offset and target verify levels. In this case, when an offset verify level of a data state is reached, the bit lines are floated for the selected storage elements which are to be programmed to the data state. This can be done without driving Vbl higher, as with the some other approaches. When the target verify level of the data state is reached, the bit lines for those selected storage elements are locked out.

The offset verify levels VvaL and VvaB can be considered to be trigger verify levels for A- and B-state storage elements, respectively, which trigger bit line floating and/or setting Vbl=Vslow.

However, these approaches use additional verify operations, resulting in a performance penalty.

FIG. 11b depicts threshold voltage distributions in an example programming technique which reduces coupling effects in the case where only one program speed mode, and one verify level per state, is used throughout the program operation. In this case, the storage elements are either in the fast programming mode or an inhibit mode. To compensate channel-to-floating gate coupling, the Vth window can be divided into three regions (assuming four data states are used) without adding any extra verify operations. In a first region, below Vva, B- and C-state storage elements will be in a fast programming mode since they are far from their destinations. The A-state storage elements can be slowed down if necessary by floating their associated bit lines. The floated bit lines can be coupled by the neighbor bit lines when the neighbors get inhibited. After the A-state storage elements pass Vva, they get inhibited.

In a second region, from Vva to Vvb, when the B-state storage elements pass Vva, their associated bit lines are floated to receive the coupling from the neighbor inhibited bit lines so that they slow down to prevent over programming. In a third region, above Vvb, after the B-state storage elements pass the B verify level (Vvb), they are inhibited. The C-state storage elements are in the fast programming mode until they reach Vvc. The target verify levels Vva and Vvb can be considered to be trigger verify levels for B- and C-state storage elements, respectively, which trigger bit line floating.

This approach allows coupling from one or more adjacent or other neighboring unselected bit lines, if present, to reduce the programming speed for a selected bit line for all, or a selected portion, of a programming operation. Note that this approach does not require knowing whether there is one or more adjacent unselected bit lines, so that steps for obtaining this information, and the associated performance penalty, are avoided. The programming speed is reduced automatically in proportion to the amount of coupling which is present. In particular, floating a selected bit line will allow the bit line to be coupled higher by neighboring unselected bit lines. The bit line, with a large capacitance on the order of 3 pF, can serve as a power supply to the associated channel, which has a very small capacitance (perhaps 1% of 3 pF). For the bit lines with a coupled voltage, the channel is at the same voltage as the bit line. An inhibited bit line's voltage is sufficiently high relative to the pass transistor SGD that the channel floats and is dissociated from the bit line. The floating channels are coupled later on by the rising word line voltage and achieve a high boosted voltage to prevent further programming.

An indication that a selected storage element should have its bit line floated and thereby be subjected to slowed programming as a form of compensation can be made by setting a "slow down" bit in a UDL latch, as discussed further below.

Ideally, the slow down via a floated bit line should be done about 500 mV before the target verify level (assuming a worst case channel-to-floating gate coupling of 500 mV). Providing a slow down via floated bit lines as discussed for A- and B-state storage elements may result in about two additional verify pulses. However, no additional programming pulses are incurred because the program pulses are shared with C-state programming. The slow down for C-state storage elements may result in about two additional programming pulses. However, such tradeoffs result in tighter Vth distributions. To reduce the performance penalty, one implementation is to not slow down the C-state storage elements. The C-state actually has a lower probability of channel-to-floating gate coupling effects than the other two states, A and B, since most of the storage element programming to the other states are inhibited when the C-state storage elements continue programming. Moreover, if the neighbor storage elements are inhibited many program pulses before the C-state storage elements reach their verify level, the channel-to-floating gate coupling phenomenon will not widen the Vth distribution.

Note that when relatively more bit lines are grounded, early in the programming operation, there is less chance of coupling across bit lines, since a grounded bit line generally stops such coupling.

In further detail, assume a staircase increasing Vpgm is used as in FIG. 8. Typically, a first set of the program pulses are used to program the A-state storage elements, an overlapping second set of program pulses are used to program the B-state storage elements, and an overlapping third set of program pulses are used to program the C-state storage elements. Assume there is some slowing down at the very beginning of the A-state phase due to bit line floating. This results in finishing the A-state programming phase later compared to a case with no slow down. Moreover, if we have a slow down for the B-state, we will also finish the B-state programming phase later compared to a case with no slow down. However, since the storage elements share the same program pulses, it is acceptable for the A- and B-state storage elements to take longer to program, and to perform more verify operations, since the overall programming time is not increased. The overall programming time is based on the programming time of the highest state.

Thus, when the C-state storage elements are slowed down, there is a penalty in overall programming time. Generally, note that the channel-to-floating gate coupling effect involves a probability that a bit line is almost locked out when a neighbor bit line gets locked out, which occurs relatively infrequently. The combination of this rare event in the C-state is an even rarer event. Slowing down the C-state storage elements can increase the overall programming time by, e.g., two program iterations.

Figure 11C:
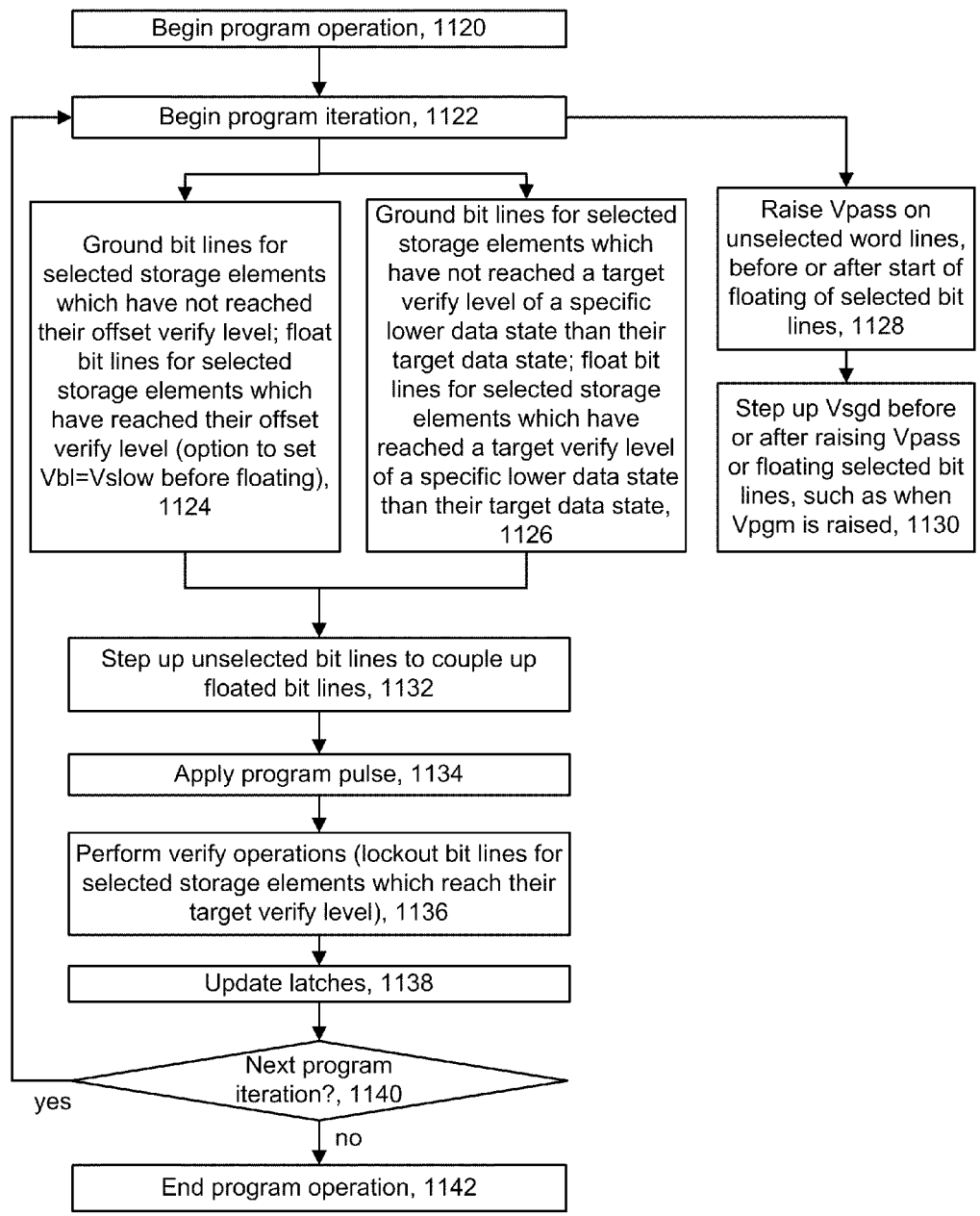
FIG. 11c depicts an example programming process related to FIG. 11a and 11b.

FIG. 11c depicts an example programming process related to FIGS. 11a and 11b. A programming operation begins at step 1120. A programming iteration begins at step 1122.

In one option, corresponding to FIG. 11a, at step 1124, the bit lines are grounded for the selected storage elements which have not reached their offset verify level (which is a lower verify level than the selected storage element's target verify level), and the bit lines are floated to provide compensation for the selected storage elements which have reached their offset verify level. For example, VvbL is the offset verify level for a B-state storage element, where the target data state is the B-state and the target verify level is Vvb. An option is to set Vbl=Vslow before floating the bit lines, e.g., so that they float at a level which is slightly above Vslow. Otherwise, Vbl=0 V before floating the bit lines, e.g., so that they float at a level which is slightly above 0 V.

In another option, corresponding to FIG. 11b, at step 1126, the bit lines are grounded for the selected storage elements which have not reached the target verify level of a specific lower data state than their target data state (which is a lower verify level than their target verify level), and the bit lines are floated to provide compensation for the selected storage elements which have reached the target verify level of the specific lower data state. For example, Vva is a target verify level of a lower data state than a target data state of the B state. That is, the A-state is one state lower than the B-state. In an eight-level device with states Er (denotes an erase state different from the higher E state), A, B, C, D, E, F and G, state D is two states lower than state F, for instance.

Step 1132 includes stepping up the voltage on the unselected bit lines to couple up the floated bit lines. A program pulse is applied at step 1134.

Figure 15:
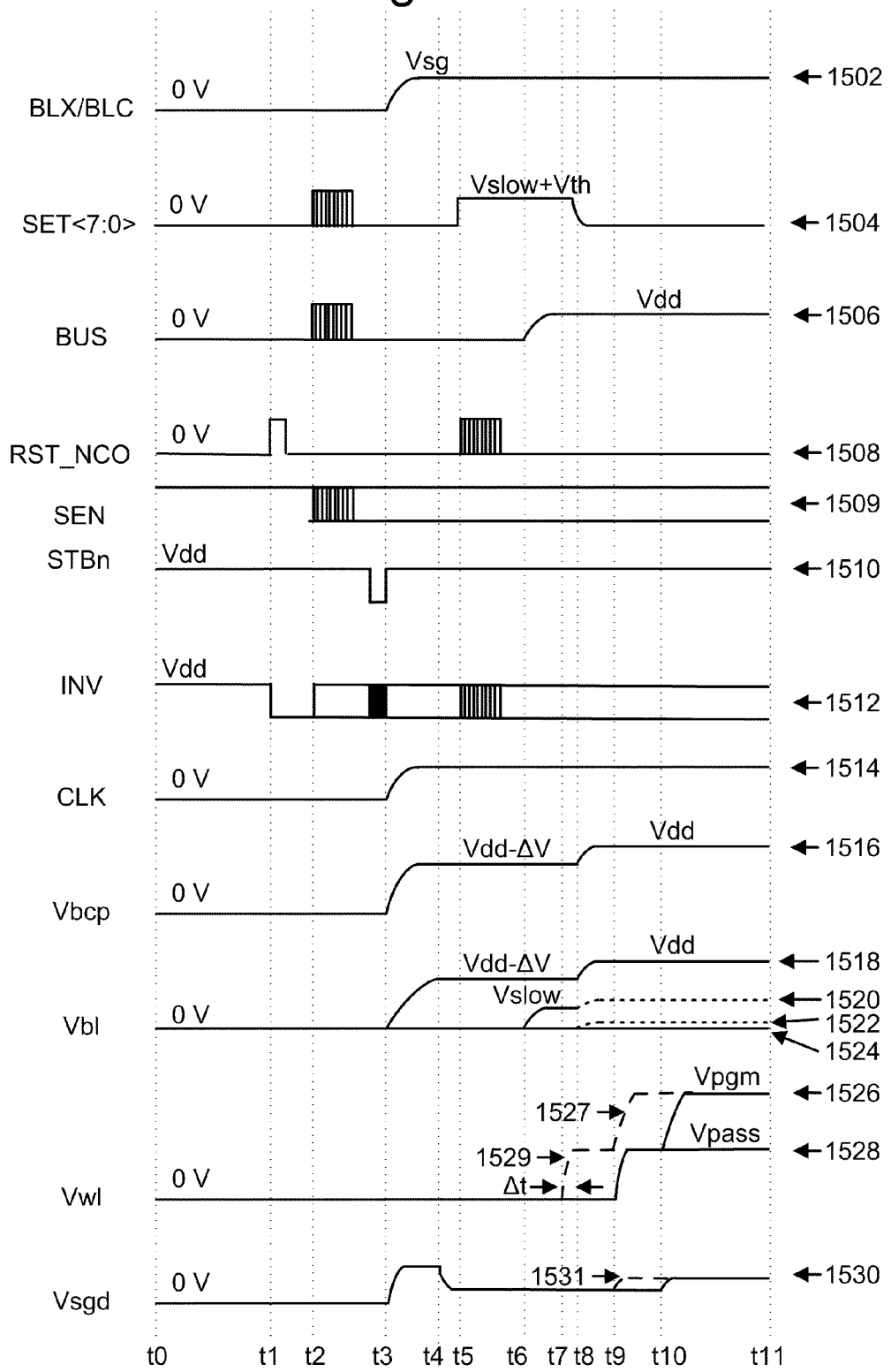
FIG. 15 depicts a time line associated with the sensing circuit of FIG. 14.

Step 1128 includes raising Vpass on unselected word lines. This can occur before or after the start of the floating of the selected bit lines. Step 1130 includes stepping up Vsgd before or after raising Vpass or floating the selected bit lines. Vsgd can be stepped up at the same time (before Vpgm when the channel boosting relies on Vpass, or after Vpgm when the channel boosting relies on Vpgm) Vpgm is raised. This is an optional step in normal programming where the inhibit bit lines do not have the step up. FIG. 15, discussed further below, illustrates some of the steps of FIG. 11c. For example, it shows Vbl for a grounded bit line (1524), Vbl for a floated bit line (1522), where the floating starts at t8, stepping up of Vbl of unselected bit lines (1518) at t8, raising Vpass (1529) on unselected word lines before (at t7) the floating (at t8) of the selected bit lines, raising Vpass (1528) on unselected word lines after (at t9) the floating (at t8) of the selected bit lines, and stepping up Vsgd (1530 or 1531, at t9 or t10, respectively) after raising Vpass (at t7 to t9, respectively). Vsgd is the gate voltage of a drain select transistor (e.g., 322, 342 and 362 in FIG. 3) that is provided between a storage element and a respective bit line (e.g., 321, 341 and 361 in FIG. 3).

Step 1136 includes performing verify operations. A result of the verify operations is used to lockout the bit lines for the selected storage elements which reach their target verify level. Step 1138 includes updating latches in the sense circuits based on the results of the verify operations. If there is a next program iteration at decision step 1140, processing continues at step 1122 in a next program iteration. If decision step 1140 is false, the programming operation ends at step 1142.

Note that steps 1124, 1128, 1130, 1132 can 1134 overlap in time, at least in part. Similarly, steps 1126, 1128, 1130, 1132 can 1134 overlap in time, at least in part. Generally, a bit line which is to be coupled up should be floated before stepping up the unselected bit lies. Moreover, the desired bit line and SGD voltages should be established by the time Vpgm is applied.

Note that the various programming techniques described herein can be implemented with appropriate logic in a control circuit.

FIG. 11d depicts data latches for respective bit lines. As mentioned, data latches can be used to store a slow down bit. The bit can have one value (1) which indicates that an associated storage element should be subject to a slow down by having its bit line floated during at least part of a programming operation. The bit can have another value (0) which indicates that the associated storage element should not be subject to a slow down, and instead should be subject to fast programming by having its bit line grounded during at least part of a programming operation. The bit value can change during the programming operation and be read by control circuits to control the bit lines appropriately, typically via an associated sense circuit.

Generally, multiple data latches, each storing one bit of data, can be provided for each bit line. The latches identify when an associated storage element has reached certain mileposts in a programming operations. For example, latches may identify that a storage element has not yet completed programming (e.g., its Vth is below a target verify level such as Vva, Vvb or Vvc), or has completed programming (e.g., its Vth is above a target verify level). Latches may also identify that a storage element's Vth is below an offset verify level (e.g., VvaL or VvbL), is above an offset verify level (e.g., VvaL or VvbL) but below a target verify level (e.g., Vva, Vvb or Vvc), e.g., in a slow programming mode, or is above the target verify level.

A first set of latches 1201, referred to as XDL latches, includes latches 1200, 1202, 1204, 1206 and 1208. The XDL latches can be used to store a lower page of data, for instance. An XDL latch is flipped when a lower page bit is stored in an associated storage element. A second set of latches 1211, referred to as UDL latches, includes latches 1210, 1212, 1214, 1216 and 1218. In one possible implementation, a UDL latch is flipped when an associated storage element is in a slow programming mode, e.g., when its Vth is between offset and target verify levels. In the implementation of FIG. 11a, the UDL latch stores a bit which is flipped when an associated storage element transitions from a slow programming mode in which its channel is floated to a fast programming mode in which its channel is grounded. A third set of latches 1221, referred to as LDL latches, includes latches 1220, 1222, 1224, 1226 and 1228. The latches are connected to representative bit lines BLi−2, BLi−1, BL, BLi+1 and BLi+2. The LDL latches can be used to store an upper page of data, for instance. An LDL latch is flipped when an associated storage element completes programming, e.g., when its Vth exceeds a target verify level such as Vva, Vvb or Vvc.

FIG. 11e depicts bit assignments for the latches of FIG. 11d. E denotes the erased state. Af, Bf and Cf denote the fast programming mode for the A-state, B-state and C-state storage elements, respectively, with the channels grounded. As, Bs and Cs denote the slowed programming mode for the A-state, B-state and C-state storage elements, respectively, with the bit lines floated. Ain, Bin and Cin denote the inhibited mode for the A-state, B-state and C-state storage elements, respectively. Lockout and lockout1 denote first and second data transfers from the data latches to control the bit line in the sense circuit, respectively. The first transfer puts data into the sense node, with a capacitor as a dynamic latch, and then transfers the data to the latches, and the second transfer replaces some data onto the latch, as discussed further below. These data transfers provide a way to control the voltages in the sense circuit. For example, we may use one voltage for inhibiting and one voltage for slowing down. Lockout1 can be used to indicate whether a bit line is in a slow programming mode.

In this implementation, UDL=1 indicates the slow programming mode is in effect for the A, B- and C-states. During programming, the control circuits read the latch data for a selected storage element and, in response to the data, determine whether the selected storage element should be programmed with its bit line floated or grounded. The control circuits then transfer in corresponding data to the sense circuits.

FIG. 12 depicts threshold voltage ranges of a data state for a fast programming mode with no compensation, a slow programming mode with compensation, and a lockout/inhibit condition. Generally, channel-to-floating gate coupling is of highest concern for storage elements which are in a slow programming mode, when more precise control of the rate of increase of Vth is desired. The highest state (e.g., the C-state) may not use the slow programming mode since compensation for channel-to-floating gate coupling is less important than for other states. C-state programming is therefore not slowed down and does not result in an overall performance penalty. The slow programming mode for the A- and B-states incurs a penalty, such as a couple more verify operations. As a result, for the B-state as an example, it is possible to have a range of threshold voltages 1254 in which fast programming occurs, with the channel grounded, and there is no compensation for channel-to-floating gate coupling. The range 1254 extends up to VvbL. A range of threshold voltages 1256 is provided in which slow programming occurs with compensation for channel-to-floating gate coupling, and corresponds to a Vth distribution 1250. The range 1256 extends from VvbL to Vvb. A range of threshold voltages 1258, above Vvb, and corresponding to a Vth distribution 1252, is also provided in which B-state storage elements are in a locked out/inhibit condition. The discussion can be generalized to other states as well.

A potential drawback is that the storage elements which are close to the range 1256, e.g., close to and just below VvbL, are in danger of being influenced by channel-to-floating gate coupling and having their Vth jump to the upper tail of the Vth distribution 1252, causing Vth distribution widening.

An alternative approach is to float the bit lines of the fast programming mode storage elements to slow down their programming, regardless of the target state. Both options could be implemented in a memory device to determine which is optimal.

Various programming techniques which provide compensation for channel-to-floating gate coupling are detailed below.

Figure 13:
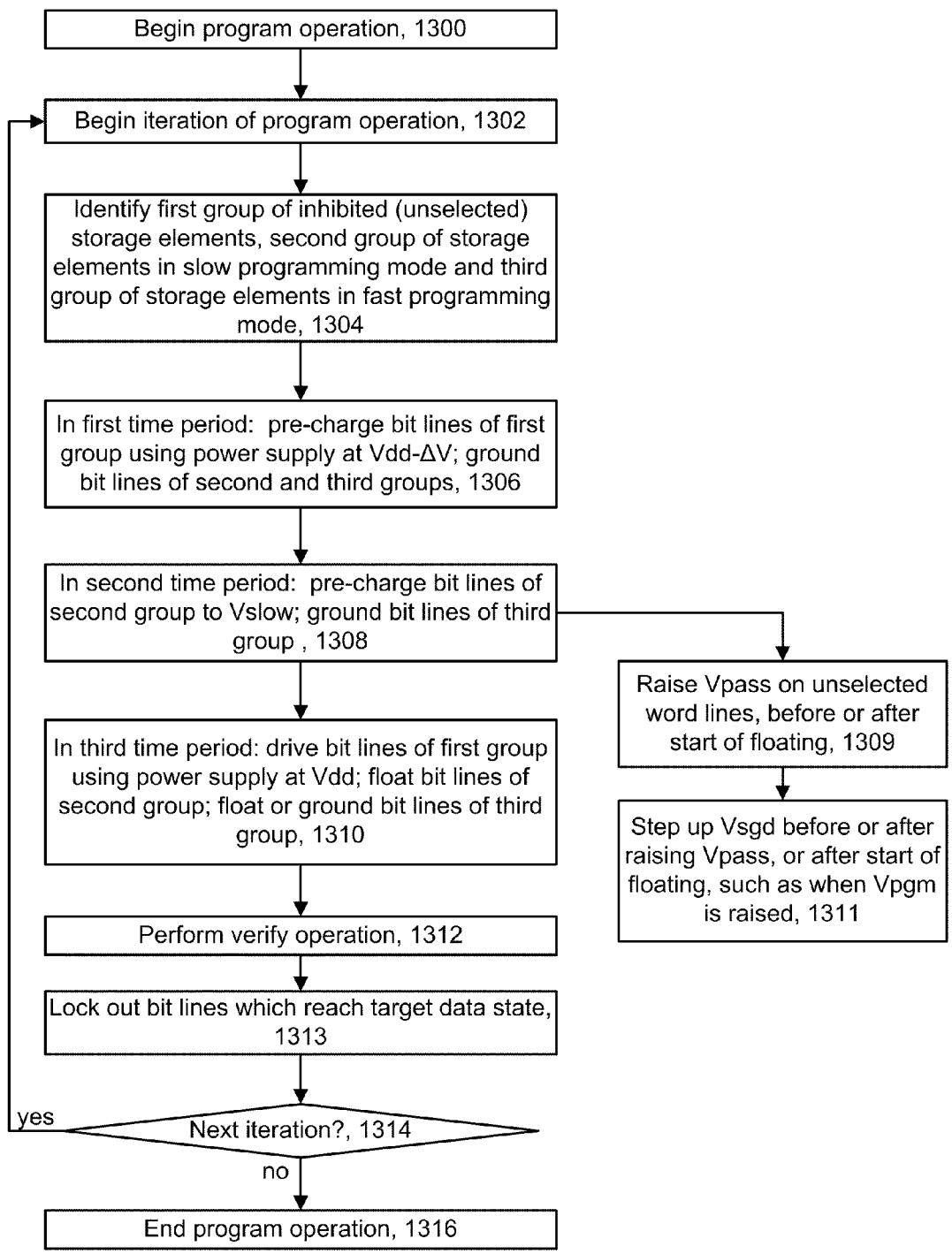
FIG. 13 depicts a method for programming a set of non-volatile storage elements in which a voltage of inhibited bit lines is stepped up using two drive voltages to induce compensation coupling to neighboring bit lines.

FIG. 13 depicts a method for programming a set of non-volatile storage elements in which a voltage of inhibited bit lines is stepped up using two drive voltages to induce compensation coupling to neighboring bit lines. A programming operation begins at step 1300. An iteration of the programming operation begins at step 1302. Step 1304 identifies a first group of inhibited (unselected) storage elements, a second group of storage elements in a slow programming mode and a third group of storage elements in a fast programming mode. The first group represents unselected storage elements, and the second and third groups represent selected storage elements. This identification can be made by control circuits by reading latch data, for instance. The first group includes a first storage element in communication with a first bit line, the second group includes a second storage element in communication with a second bit line, and the third group includes a third storage element in communication with a third bit line. The storage elements and bit lines can be in any relative position to one another, in a memory array.

Step 1306 includes, in a first time period, pre-charging bit lines of the first group using a power supply at Vdd−ΔV (an initial level), and grounding bit lines of the second and third groups. ΔV represents a voltage step up which will be subsequently induce coupling from an unselected bit line to a selected bit line to counteract channel-to-floating gate coupling which is experienced by the selected storage elements. That is, for a selected storage element, the raised floating gate potential due to channel-to-floating gate coupling is compensated for, at least in part, by raising its bit line potential.

Step 1308 includes, in a second time period after the first time period, pre-charging bit lines of the second group to Vslow. In this step, to prevent undesirable coupling effects, it is desirable to bias the inhibit bit line and the grounded bit line actively, so that they are not left floating.

Step 1310 includes, in a third time period after the second time period, driving the bit lines of the first group using a power supply at Vdd (a stepped up level), floating the bit lines of the second group, and floating or grounding the bit lines of the third group.

In the same period, step 1309 includes raising Vpass on the unselected word lines, before or after the start of floating, after which step 1311 includes stepping up Vsgd before or after raising Vpass, or after the start of the floating, such as when Vpgm is raised on the selected word line. Steps 1309 and 1311 can be initiated at various times relative to the timing of step 1310. In some cases, step 1309 can be initiated before step 1310 where the Vpass on unselected word lines raises before the voltage step up of the unselected bit lines. In another case, step 1309 can be initiated after the step 1310 where the unselected bit lines change their voltage and then Vpass on the unselected word lines is raised to achieve channel boosting. In another case, step 1311 following step 1309 can be initiated ahead of step 1310 where the unselected floating channel will be first boosted, then the unselected bit lines are raised to the final Vdd level, and then Vsgd is raised. Initiating step 1310 after the boosting step 1309 can be advantageous in that the channel for the compensated bit line (which is coupled up by the neighboring unselected bit lines) will not face the possibility of its associated channel being boosted inadvertently where programming stops instead of being slowed.

Moreover, different techniques may be used for different selected word lines, where floated channels associated with some word lines are boosted by the unselected Vpass voltage (referred to as Vpass boosting) and floated channels associated with some other word lines are boosted by the selected word line Vpgm (referred to as Vpgm boosting) depending on the boosting mode used. Step 1309 can include both Vpass boosting and Vpgm boosting cases. For the Vpass boosting case, step 1309 represents the time at which Vpass is raised. For the Vpgm boosting case, step 1309 represents the time at which Vpgm is raised.

By raising the bit lines of the first group from Vdd−ΔV to Vdd, a step up of ΔV couples from the bit lines of the first group to the bit lines of the second and third groups, based on the magnitude of ΔV and the pattern of the bit lines. The word line voltage on selected and unselected word lines will couple up the floated bit line for inhibiting, on the first group of storage elements. The floating bit lines for the second and third group of storage elements serve as a voltage bias for the associated bit lines and these bit lines are not coupled up by the word lines. This is mainly due to the capacitance difference between the bit line and channel, where the bit line, with a large capacitance, serves as reservoir to the channel, with a small capacitance.

Coupling from the first group bit lines raises the potential of the second group bit lines above Vslow by Cr×ΔV, where Cr is a coupling ratio. Similarly, when the third group bit lines are floated, the coupling from the first group bit lines raises their potential above 0 V based on ΔV and a coupling ratio. However, when the third group of bit lines is grounded, in another possible approach, they remain at 0 V and are not affected by the ΔV step up. The amount of coupling which is experienced by a given selected bit line depends, e.g., on the distance to, and number of, stepped up bit lines.

Step 1312 includes performing one or more verify operations for the selected storage elements in the second and third groups. Step 1313 includes locking out bit lines which reach a target data state. At decision step 1314, if there is a next programming iteration, processing continues at step 1302; else the programming operation ends at step 1316.

Figure 14:
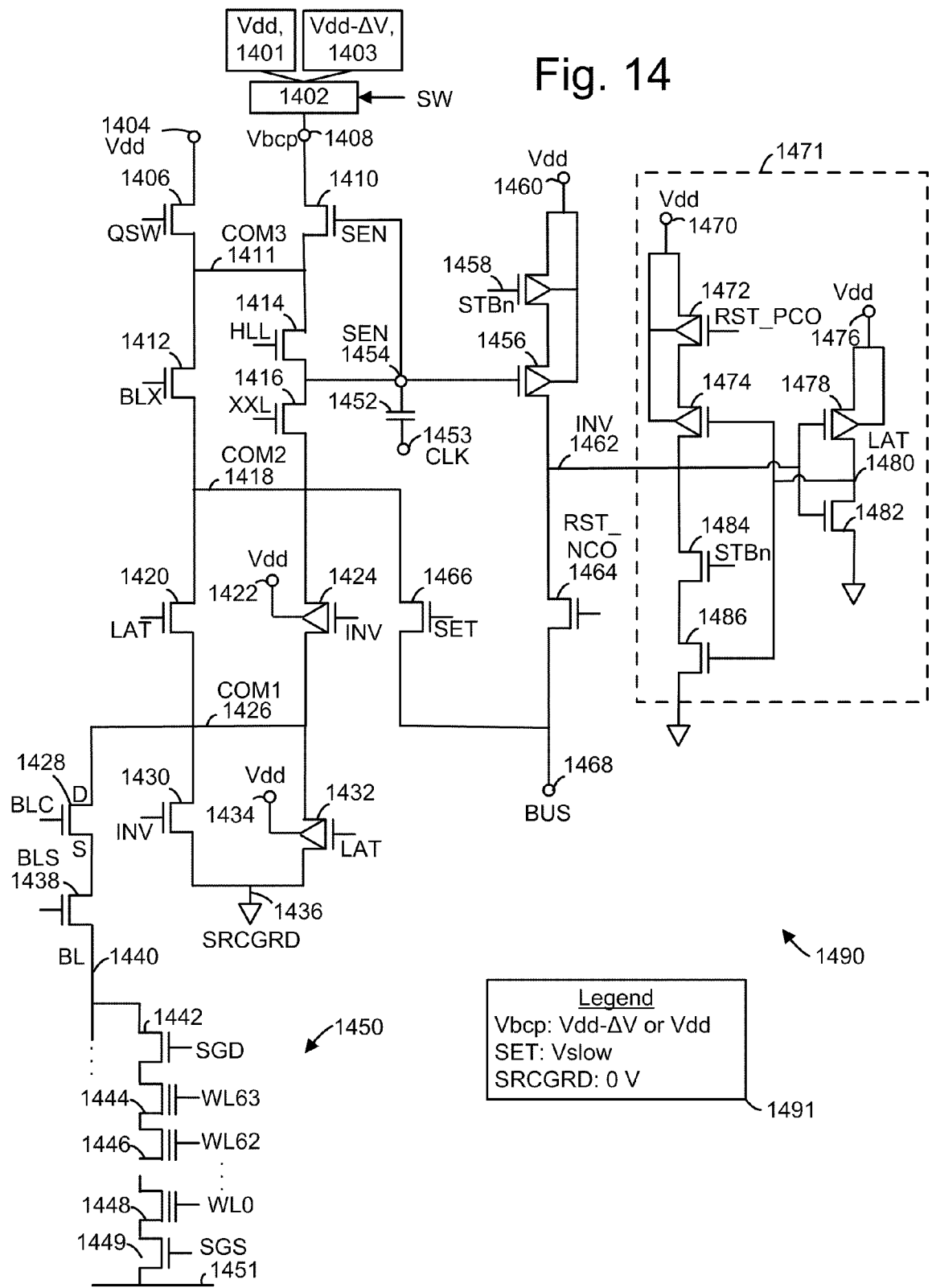
FIG. 14 depicts a sensing circuit in which drive voltages are used for inhibited bit lines, for use with the process of FIG. 13.

As an example, the process of FIG. 13 can be implemented using the sense circuit of FIG. 14 and the time line of FIG. 15. For example, the first time period can correspond to t3-t6 in FIG. 15, the second time period can correspond to t6-t7 or t6-t8, and the third time period can correspond to t7-t11 or t9-t11.

FIG. 14 depicts a sensing circuit in which drive voltages are used for biasing bit lines, for use with the method of FIG. 13. Various sense circuit configurations can be used. The operation of the various sense circuits described herein can be understood based on their collective descriptions, noting that like-named components can perform common functions. A large number of sense circuits, e.g., 64K sense circuits in a plane, typically receive common control signals unless otherwise indicated, and access one or more common power supplies. See, e.g., a common power supply 405 in FIG. 4. For example, common control signals such as BLX, BLC, CLK, ICO, LCO and FCO, are described further below. Examples of signals which are local to a sense circuit are BUS, SEN, LAT and FLG, described further below. Regarding the power supply, the transistor gate voltages in the sense circuit are provided by global circuits at the edge of large group of sense circuits. These can be high voltage such as Vdd+Vth. Since the gates are capacitively loaded, they can use a high voltage. However, for the sense circuit drain/source voltage, the power may be limited to Vdd to avoid consuming a large amount of current.

A separate copy of the sense circuit 1490 can be provided for each bit line, and the sense circuits are configured differently according to whether the bit line is associated with a storage element which is inhibited from programming, is in a slow programming mode, or is in a fast programming mode. One or more control circuits can communicate commands to each sense circuit to configure them, as well as to exchange data, such as read and write data.

A sense circuit can be characterized by a number of latches it provides to store data, and a number of voltages it can provide to a bit line. Techniques provided herein optimally leverage the capabilities of the sense circuit while allowing the sense circuit to be as compact and efficient as possible. An example implementation includes two latches and can provide three voltages to a bit line, namely 0 V, a slow programming mode voltage, Vslow, and Vdd. See legend 1491, which indicates which components are used to set which voltages. One latch 1471 is a full latch at LAT 1480 and its complimentary node INV 1462, and the other latch is a dynamic capacitor latch provided by capacitor 1452 with the storage node at SEN 1454 and a clock (CLK) node 1453 as a ground plate.

The transistors in the sense circuits herein may include nMOSFETs (nMOSs) and pMOSFETs (pMOSs), for instance. A NAND string 1450 is connected to the sense circuit 1490, and includes storage elements 1444, 1446 and 1448 in communication with word lines WL63, WL62, . . . , WL0, respectively, for example, and with a bit line (BL) 1440 via an SGD transistor 1442. The NAND string 1450 also includes a source select gate SGS 1449 connected to a common source line 1451 for multiple NAND strings. The bit line 1440 communicates with a BLS transistor 1438 and a BLC (bit line clamp) transistor 1428, which is coupled to a COM1 path 1426. The BLS transistor 1438 is a high-voltage transistor which can isolate the sense circuit, which has low voltage transistors, from high voltages of the memory array. During sensing, BLS is conductive. The BLC transistor can clamp a voltage on a bit line by control its gate voltage and supply of a sufficiently high voltage such as Vdd on the drain of the transistor.

The BLC transistor 1428 has a source (S) side and a drain (D) side. An input to an INV transistor 1430 is an inverse of an input to a LAT transistor 1432, which receives a power supply Vdd via a terminal 1434 for the n-well of the pMOS 1432. These transistors are connected to a source ground (SRCGRD) node 1436. Similarly, an input to a LAT transistor 1420 is an inverse of an input to an INV transistor 1424, which receives Vdd via a terminal 1422 for the n-well of the pMOS 1424.

In one path, a BLX transistor 1412 extends between a COM2 path 1418, a COM3 path 1411, and a QSW transistor 1406, which in turn is connected to a power supply terminal 1404. In another path, an HLL transistor 1414 and an XXL transistor 1416 extend between the COM2 path 1418 and a SEN transistor 1410, which in turn is connected to a power supply terminal BCP 1408. The HLL transistor 1414 sets an initial voltage at the SEN node 1454 at the beginning of a sense operation to setup the voltage on the SEN node. XXL, SET and BUS are controlled in the sensing operation to determine whether SEN is discharged after a discharge period, e.g., to 0 V, or maintained at Vdd, depending on the voltage on BUS 1468. The capacitor 1452 can be used to store data which determines whether the bit lines should be actively biased at Vbcp by controlling the transistor 1410 to be in a conductive state, allowing node 1408 to communicate with the bit line. Moreover, a step up of Vbcp from Vdd–ΔV to Vdd for an unselected bit line can be used as part of a process to determine whether coupling compensation is needed for selected bit lines, as discussed further below.

In one possible approach, the Vbcp node 1408 is connected to a switch 1402 which selects a first power supply 1401 which provides an output or drive voltage at Vdd, or a second power supply 1403 which provides an output or drive voltage at Vdd–ΔV. The power supplies may be in the range of, e.g., 1.7 to 2.5 V. The power supplies can be separate, or one power supply can be provided which uses two outputs. A control signal SW may be used to control the switch 1402. The power supply and switches which are global controls for all sense circuits can be placed at the edge of the group of sense circuits. The sense circuit 1490 can be controlled to directly drive the bit line 1440 of the NAND string 1450, representing an unselected NAND string, by Vdd or Vdd–ΔV, to provide the ΔV step up, so that precise control of the ΔV coupling to the selected bit lines can be provided without the possibility of floating the bit line.

In one possible implementation, a common control signal SW is sent to each sense circuit of an inhibited bit line to select either 1401 or 1403 via a switch. A common Vdd or Vdd–ΔV can be provided in respective paths to each sense circuit of unselected bit lines. Note that the transistor 1410, under the control of SEN, determines whether Vdd or Vdd–ΔV can pass to the bit lines.

If Vbcp is fixed at Vdd, Vbl can be controlled by nMOS clamping, such as by the BLC transistor 1428. nMOS clamping provides Vbl at a level which is in proportion to the BLC gate voltage (Vgs). Generally, BLC clamping can be used to set a voltage on a bit line without floating the bit line. However, in some situations, a clamped BLC can be cutoff. For example, during the process of the bit line charging up to the set voltage, Vbl can be coupled up as the neighbor bit lines charges up. Once the voltage is coupled above the set voltage, the BLC transistor can be cutoff when Vgs falls below Vth, so that the bit line is left floating. A floating bit line is not driven at a controlled level, but assumes a level based on, e.g., a past driven level before floating, and effects such as capacitive coupling.

In particular, if Vdd–ΔV and then Vdd were supplied for an unselected bit line by biasing the gate of the BLC transistor 1428 (e.g., at Vdd–ΔV+Vth and Vdd+Vth, respectively), the unselected bit line can be coupled up via bit line coupling from the bit lines of slow programming mode storage elements, when their bit lines are charged to the initial level of Vslow. This can cause the BLC transistor 1428 to be cut off. The BLC transistor 1428 will be conductive if its gate voltage exceeds the sum of its threshold voltage (Vth) and its source voltage (Vbl). If the voltage of the unselected bit line is raised, the BLC gate voltage will not be sufficiently high to keep the BLC transistor in a conductive state.

One way to resolve this floating problem is to separately control the drain voltage of the BLC transistor by the power supplies 1401 or 1403, which provide a switchable supply Vbcp. Initially, for an unselected bit line, the drain voltage of the BLC transistor is at Vdd−ΔV, and this is transferred to the channel when the BLC gate voltage is sufficiently high for the BLC to act as a pass gate. The pre-charge peak current, Icc, can also be controlled by the voltage supply ramp rate. The drain voltage of the BLC transistor is subsequently raised up to Vdd. SEN node 1454, with the help of stepping up CLK 1453, is high enough to pass Vdd at the transistor 1410. Recall that the step up of ΔV on an unselected bit line can be used to intentionally induce coupling to selected bit lines to slow their programming.

For a selected bit line in a slow programming mode, a SET transistor 1466 can provide Vslow to the bit line 1440 via INV 1424, LAT 1420, BLC 1428 and BLS 1438 transistors. The COM2 path 1418 is connected to a bus terminal 1468 via the SET transistor 1466 for input and output of data from SEN node 1454. The SEN node 1454 is connected to the CLK terminal 1453 via the capacitor 1452. The SEN node 1454 is also coupled to an INV path 1462 via a transistor 1456, and the INV path 1462 is coupled to the bus terminal 1468 via a reset (RST_NCO) transistor 1464. The transistor 1456 is coupled to a power supply node 1460 via a STBn transistor 1458 which receives a strobe signal during sensing. The INV path 1462 is also coupled to ground via an STBn transistor 1484 and a pull down transistor 1486. The SEN node 1454 can be inverse transferred to the INV node 1462 when STBn 1458 goes to 0 V. The INV node 1462 can be initialized to 0 V through transistor RST_NCO 1464 when BUS 1468 is at 0 V. On the other hand, if the INV node needs to be initialized to a high potential such as Vdd, the SEN node 1454 will be initialized to 0 via path XXL 1416 and SET 1466 when BUS 1468 is at 0 V.

In the latch 1471, a LAT path 1480 is an inverse of the INV path 1462. LAT 1480 is coupled to a power supply node 1476 via a transistor 1478, and to a power supply node 1470 via a transistor 1474 and a RST_PCO transistor 1472. LAT 1480 is also coupled to ground via a pull down transistor 1482. The transistor 1484 with gate STBn cut offs a "fight" between the pull up path 1456 and 1468 versus the pull down path 1484 and 1486. The transistor RST_PCO 1472 is for cutting off the pull up path when INV needs to be updated to 0 through the RST_NCO path 1464.

FIG. 15 depicts a time line associated with the sensing circuit of FIG. 14. Time points t0-11 are depicted. The time lines are not to scale. The time line extends over a single iteration of a programming operation which encompasses multiple iterations, and one or more verify operations (not depicted) can follow the period encompassed by the time line for each iteration.

The waveforms correspond to the like-named components in FIG. 14. QSW, HLL and XLL=0 V in the time period shown. Waveform 1502 is the voltage for the BLX/BLC transistors gate bias. Waveform 1504 is the voltage for SET transistor gate bias. Waveform 1506 is the voltage for BUS. Waveform 1508 is the voltage for RST_NCO. Waveform 1509 is the voltage for the sense node SEN. Waveform 1510 is the voltage for STBn. Waveform 1512 is the voltage for INV. Waveform 1514 is the voltage for CLK. Waveform 1516 is Vbcp. Waveform 1518 is the Vbl for unselected bit lines. Waveform 1520 is the Vbl for selected bit lines in a slow programming mode, with compensation. Waveform 1522 is the Vbl for selected bit lines in a fast programming mode, with compensation, when the bit line is floated. The dashed lines represent a floating voltage. Waveform 1524 is the Vbl for selected bit lines in a fast programming mode, without compensation, when the bit line is grounded. The time line can be understood by considering three representative bit lines: a first bit line associated with an inhibited or unselected storage element (a first storage element), a second bit line associated with a slow programming mode storage element (a second storage element), and a third bit line associated with a fast programming mode storage element (a third storage element).

Waveform 1526 is the selected word line voltage (Vwl), and waveform 1528 is the unselected word line voltage, for the case where Vpass is raised after the ΔV step up at t8. At is a rise time of Vpass. Waveform 1527 is the selected word line voltage, and waveform 1529 is the unselected word line voltage, for the case where Vpass is raised before the ΔV step up at t8. Waveform 1530 or 1531 is the drain select gate voltage (Vgsd) when Vpass is raised after or before, respectively, the ΔV step up at t8.

At t1, RST_NCO goes high, allowing the bus node 1468, at ground, to communicate with the INV path 1462, effectively resetting INV 1462 to 0 V. At t2, SET goes high serially in the no. 0 to no. 7 sensing circuits. In this implementation, one circuit, such as the common portion 590 of a sense block 500 (FIG. 6), provides voltages to eight sense circuits (each analogous to the sense module 580) serially on a bus, and each sense circuit receives a SET voltage in turn.

The SEN node 1454 is allowed to discharge when BUS is at 0 for some sensing circuits, or not discharged when the BUS is held high for the other sensing circuits. At 1510, STBn goes low, and the inverse of the SEN node value is saved at the INV node 1462.

At t3, waveform 1516 indicates that Vbcp is raised from 0 V to Vdd−ΔV, an initial level. At the same time, waveform 1502 indicates that the BLX/BLC control gate voltages are raised from 0 V to a level Vsg, e.g., 4-5 V, which is sufficiently high to cause the BLX/BLC transistors to act as pass gates, passing Vdd−ΔV to the unselected bit lines (waveform 1518). There is no risk of floating the unselected bit lines, compared to the case where BLC clamping is used to set Vbl. If Vblc were lower, the bit lines would be clamped and floated, as mentioned. Specifically, the rise in CLK at t3 boosts the SEN node 1454 to a high level to turn on the SEN transistor 1410 so that the unselected bit lines are driven at Vdd−ΔV. The SEN transistor 1410 and SGD 1442 act as pass gates. Vbl=0 V for the selected bit lines (waveforms 1520, 1522 and 1524) at t3 through the ground path which includes transistors 1430 and 1432.

At t4, SGD is lowered to a level which allows the drain select gate to be either conductive, when Vbl is sufficiently low, allowing the bit line to communicate with the channel, or non-conductive, when Vbl is sufficiently high, thereby floating the channel since it is cutoff from the bit line.

At t5, RST_NCO and INV provide a data transfer. For the slow programming mode bit lines, the SET transistor is raised to Vslow+Vth so that Vslow is provided to the bit line when the SET transistor communicates with the bit line at t6.

At t6, BUS rises to Vdd (waveform 1506), and Vbl for the slow programming mode bit lines rises to Vslow (waveform 1520).

At t7, in one option, Vwl (waveform 1529) begins rising over a time period Δt, and reaches Vpass at t8. It is possible to adjust the Vpass rise time t7 relative to the bit line floating time t8 as previously described in FIG. 13, steps 1309 and 1310.

At t8, the voltage supply at Vdd (waveform 1516) is activated to drive the unselected bit lines, causing a ΔV step up. The control signal SW may control the switch 1402 to select the Vdd power supply 1401 instead of the Vdd−ΔV power supply 1403. As a result, the bit lines of the slow programming mode storage elements are coupled higher (waveform 1520). As discussed, this is beneficial as it counteracts channel-to-floating gate coupling to the slow programming mode storage elements. The bit lines of the slow programming mode storage elements are provided with a compensation which could not otherwise be directly provided by their sense circuits.

If the bit lines of the fast programming mode storage elements are allowed to float, e.g., by floating SRCGND, these bit lines and channels are also coupled higher (waveform 1522). This is also beneficial as it counteracts channel-to-floating gate coupling to the fast programming mode storage elements. If the bit lines of the fast programming mode storage elements are grounded (waveform 1524), they remain at 0 V. This is acceptable since counteracting channel-to-floating gate coupling to the fast programming mode storage elements is often not critical. ΔV is a design parameter which can be optimally set for a particular type of memory device to provide a desired level of coupling.

With the desired channel potentials achieved, the program pulse is applied to the selected word line (waveform 1527), and programming occurs as intended with channel-to-floating gate coupling compensated.

In the case where Vpass is not applied early, it may be applied at t9 (waveform 1528), and Vpgm applied at t10 (waveform 1526).

Vsgd can be kept constant without a step up as depicted at t9 or t10. However, there is some benefit to stepping up Vsgd after Vpass rises at t9 (waveform 1531, when Vwl waveforms 1529 and 1527 are used) or t10 (waveform 1530, when Vwl waveforms 1528 and 1526 are used) since Vsgd is at a level which determines the voltage which can be passed from the bit line to the channel (Vchannel=Vbl when Vsgd−Vth>Vbl). With Vsgd higher, more voltage can be passed from the bit line to channel, hence more slow down will be achieved. But, if Vsgd is too high, this could induce leakage for the boosted channel where the function of Vsgd is to cut off the connection between channel and bit line. The channel capacitance is so small so that a small charge leakage from channel to the bit line will be detrimental and result in program disturb. For the inhibited bit line step up, the initial Vsgd should be low enough to block the leakage from the channel to the bit line at Vdd−ΔV. The effect of neighboring word line coupling to SGD has to be taken into consideration in setting Vsgd to prevent channel leakage for the boosted channel. After the channel is boosted, the bit line is raised to Vdd. Vsgd can also be raised to Vsgd(initial)+ΔV. This provides the benefit of passing more voltage from the bit line to the channel without worrying about the boosted channel leakage since the bit line voltage is raised to Vdd.

Generally, Vsgd needs to be at a specified level when Vpass is applied. Vpass and Vpgm timing is determined by the channel boosting mechanism. If Vpass dominates the channel boosting, then the time at which Vpass rises is important in relation to the Vsgd timing. Similarly, if Vpgm dominates the channel boosting, then the time at which Vpgm rises is important in relation to the Vsgd timing. Vsgd should be sufficiently high so that the bit line can communicate with a channel of a selected storage element, but sufficiently low so that the bit line can be cutoff from the channel of an unselected storage element. However, Vsgd can be lower than this specified level from t5 to t9 or t10 to avoid leaking voltage from the inhibited bit line via the SGD transistor, and to ensure the channel is cut off. Moreover, a delay can be provided between the time that Vpass is raised and the time Vsgd is raised, to allow channel boosting to stabilize. This control technique for Vsgd can be used with the other embodiments provided herein as well, including those of FIGS. 16b, 17b-d and 18b.

The Vth of the SGD transistor can be affected by coupling from neighbor channels. With such coupling from the unselected boosted channel, the Vth to make the transistor conductive can be lower. Thus, the SGD transistor will automatically pass more voltage from the bit line to the channel when the additional voltage is needed due to increased coupling. Since the Vsgd is applied on the gate of all selected drain transistors, it can also make the boosted channel leak to the bit line if the boosted channel is next to another boosted channel. A compromise solution is keep Vsgd low when the bit line is low, and raise Vsgd when bit line voltage is high.

Figure 16A:
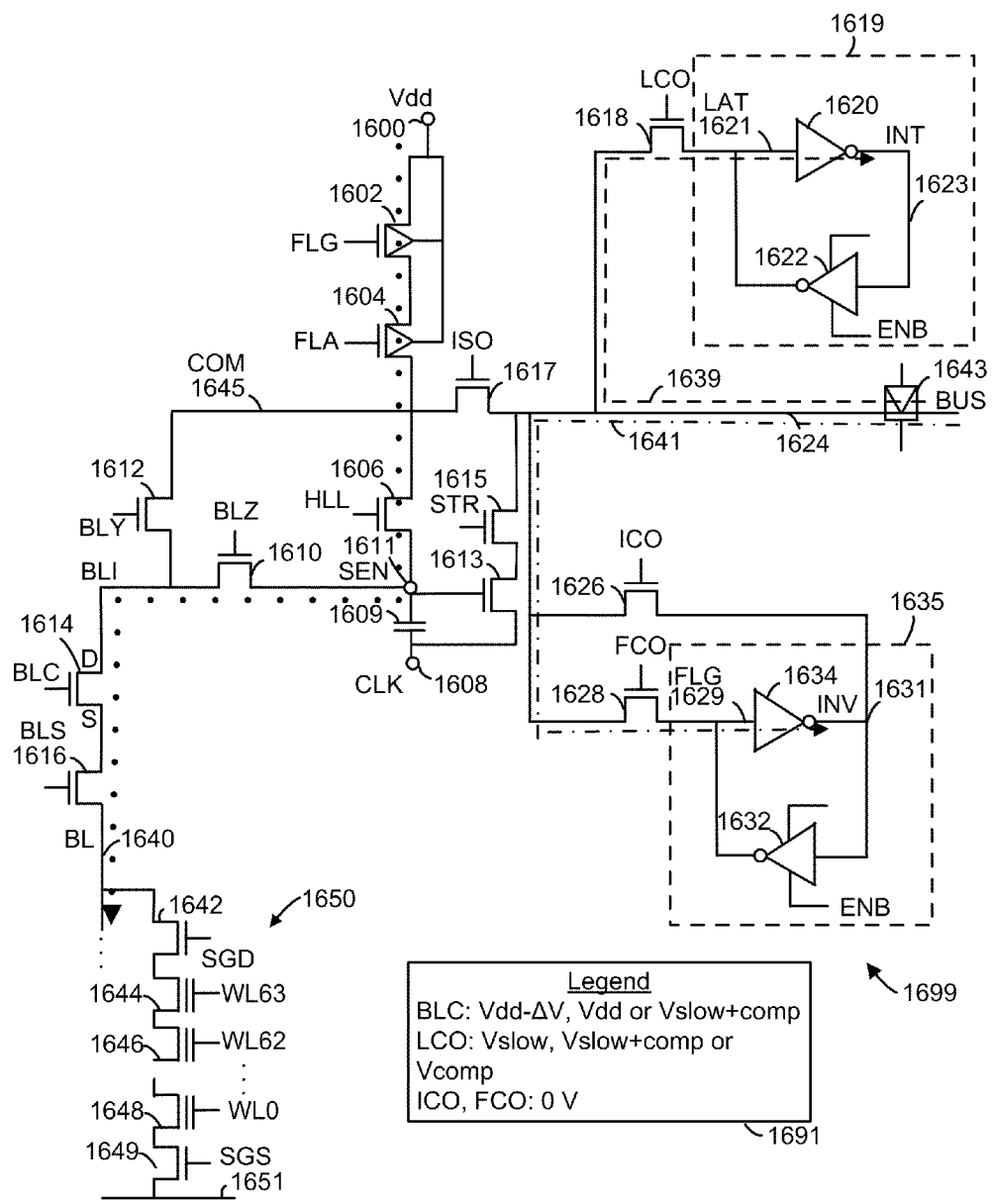
FIG. 16a depicts an alternative sensing circuit.

FIG. 16a depicts an alternative sensing circuit 1699. This example implementation includes two latches and can provide three voltages to a bit line, namely (a) 0 V, (b) Vslow, Vslow+comp or Vcomp and (c) Vdd−ΔV. See legend 1691, which indicates which components are used to set which voltages. One latch 1619 includes inverters 1620 and 1622, LAT path 1621 and INT path 1623, and another latch 1635 includes inverters 1634 and 1632, FLG path 1629 and INV path 1635. LAT path 1621 is at a non-inverted side of the latch 1619, and FLG path 1629 is at a non-inverted side of the latch 1635.

A NAND string 1650 is connected to the sense circuit, and includes storage elements 1644, 1646 and 1648 in communication with word lines WL63, WL62, ..., WL0, respectively, for example, and with a bit line (BL) 1640 via an SGD transistor 1642. The NAND string 1650 also includes a source select gate SGS 1649 connected to a common source line 1651 for multiple NAND strings. The bit line 1640 communicates with a BLS transistor 1616 and a BLC transistor 1614 having a source S and drain D. The BLC transistor 1614 is connected to a BLY transistor 1612, which in turn is connected to a bus 1624. The BLY transistor 1612 is also connected to an FLA transistor 1604 via a COM path 1645, which in turn is connected to an FLG transistor 1602. A power supply node 1600 at Vdd is connected to the FLG and FLA transistors.

An HLL transistor 1606 is connected to a sense (SEN) node 1611, and provides an initial voltage during a sensing operation. The SEN node is also connected to a clock (CLK) node 1608 via a capacitor 1609, and to a gate of a transistor 1613. The transistor 1613 is connected to the bus 1624 via an STR (strobe) transistor 1615, and to the CLK node 1608. The bus 1624, after a pass gate 1643, communicates with the latch 1619 via an LCO transistor 1618. The bus 1624 also communicates with the latch 1635 via an ICO transistor 1626 and an FCO transistor 1628. An isolation (ISO) transistor 1617 can isolate the right hand side of the circuit, including latches 1619 and 1635, from the left hand side of the circuit 1699 and the bit line, when a data transfer involving the latches occurs. Specifically, the ISO transistor isolates BUS 1624 from the COM node 1645. This isolates a data transfer from BUS 1624 to LAT 1621 from a bit line bias that is provided from FLG 1629 via BLY 1612 and BLC 1614, for more efficient concurrent operations. See waveform 1791 in FIG. 17d for further information.

During sensing, a bit line bias can be provided from FLG 1629 via BLY 1612 and BLC 1614 to the bit line BL. For example, a non-zero bias such as Vbl=0.4 V can be provided by controlling BLC. Moreover, the BLY path to bit line voltage (e.g., 0.4 V) can be different from the voltage from the BUS (0 or Vdd). Sensing is done through the STR 1615 path, not the HLL 1606 path. The HLL path is used to make the SEN voltage digitized through the LAT latch and returning to SEN. For example, the LAT latch can have its trip point at 1.2 V with a 2.5 V voltage supply. The voltage on the SEN nodes could be any value between 0 and 2.5 V. If the SEN voltage is above 1.2 V, it will be latched to be 2.5 V. Similarly, a SEN voltage lower than 1.2 V will be latch to 0 V in the LAT latch. This process of transferring a continuous voltage range to two discrete voltages is called digitizing. A digitized voltage will be stored on the SEN node after this transfer to and from LAT latch. The STR path is for more precise sensing using current sensing.

A path 1641 is used for transferring lockout data through BUS to FLG. FLG=0 for inhibit, and INV=0 for program. A path 1637 is used to charge bit lines to Vdd for the inhibited bit lines through the FLG pMOS path (1602). ICO 1626 is kept high to provide a solid ground for selected storage elements in the fast programming mode. With ICO=0 V, a path 1639 is used to transfer the lockout1 data from BUS 1624 to the LAT path 1621.

In particular, the latch 1619 has one gating device, which is the LCO transistor 1618. The bus 1624 can transfer data to the LAT path 1621 of the latch 1619 through LCO 1618. Or, the bus can transfer data to the INV node 1631 at the inverting side of the latch 1635 through the ICO transistor 1626, or to the FLG node 1629 at the positive side of the latch 1635 via the FCO transistor 1628.

For a slow programming mode storage element, LCO 1618 can have a gate voltage of Vslow+Vth to provide a bias level of Vslow to charge the bit lines. Generally, LCO can be clamped to obtain a desired supply voltage. As another example, LCO could have a gate voltage of Vslow+comp+ Vth to provide a bias level of Vslow+comp, which compensates for channel-to-floating gate coupling, for the bit line of a slow programming mode storage element. Vslow may be, e.g., 0.6-0.8 V, and Vcomp may be comparable, e.g., 0.2-0.6 V. Vslow+comp may thus be 0.8-1.4 V. Vfast+comp may equal Vcomp for the fast programming mode.

Note that, during a sensing operation, data transferred from SEN to FLG 1629 via STR and FCO has its logical value flipped. For example, if SEN=1 (high), then FLG=0 (low). This is sensing with an inversion. On the other hand, data transferred from SEN to LAT 1621 via HLL does not have its logical value flipped. For example, if SEN=1 (high), then LAT=1 (high). This is sensing without an inversion.

FIG. 16*b* depicts a time line for programming which is associated with the sensing circuit of FIG. 16*a*. In this example control technique, the BLC transistor 1614 is used to pass a voltage as high as Vdd from the sense circuit to the bit line, and the sense circuit is operated in such a way that coupling compensation is not provided. The time line depicts voltages for inhibited bit lines (Vbl(inhibit)), slow programming bit lines without compensation (Vbl(slow)), and fast programming bit lines without compensation (Vbl(fast)). Waveform 1660 depicts a voltage of the BLC transistor. Waveform 1662 depicts a BUS 1624 to FLG path 1629 data transfer at t0-t2 and a BUS 1624 to LAT path 1621 data transfer at t3-t4. Waveform 1664 depicts a bit line voltage of an inhibited bit line, Vbl(inhibit). Vbl(inhibit) is set to Vdd when FLG=0. Waveform 1666 depicts Vbl(fast), which is set at 0 V using LAT=0 (low). Waveform 1667 depicts Vbl(slow), which is set high, to Vslow, using LAT=1 (high) in combination with FLG=1 (high). Waveform 1668 depicts a voltage applied to the selected word line, and waveform 1670 depicts a voltage applied to unselected word lines. Waveform 1672 depicts the voltage applied to the ICO transistor, which updates the latch 1635 and FLG node. Waveform 1674 depicts the voltage applied to the LCO transistor for updating the LAT latch for a slow programming mode bit line. The rise in the LCO voltage at t3-t4 to a full logic level Vdd updates the LAT latch. The LCO voltage between t4 and t7 clamps the bit line voltage supply to be a designated level such as Vslow. Here, the LCO voltage is an analog voltage level passing a voltage such as 0.2 to 1.4 V to the bit line.

From t042, FCO (waveform 1676) goes high, allowing the BUS to FLG transfer to occur. ICO goes high from t1-t3. At t2, BLC rises to Vdd+Vth, so that Vbl(inhibit)=Vdd. Vbl(fast) and Vbl(slow) are at 0 V from t2-t3. From t3-t4, LCO goes high so that the BUS to LAT data transfer occurs. Vbl(fast) and Vbl(slow) are floated from t3-t4, during the BUS to LAT transfer. At t4, Vbl(slow) is raised to Vslow. At t5, Vpass is applied (waveform 1670) and at t6, Vpgm (waveform 1668) is applied.

Figure 17A:
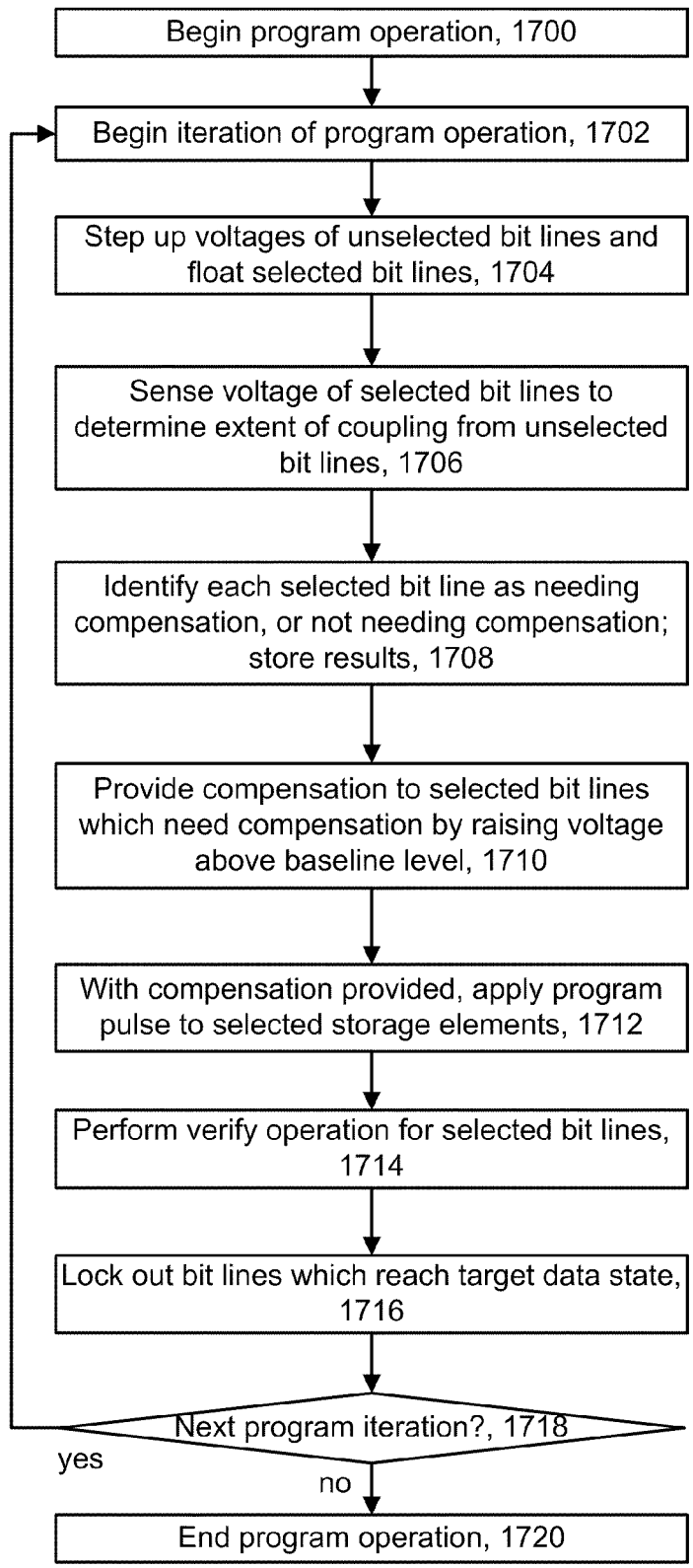
FIG. 17a depicts a method for sensing selected bit lines to determine whether coupling compensation is needed in subsequent programming.

FIG. 17*a* depicts a method for sensing selected bit lines to determine whether coupling compensation is needed, in subsequent programming. As mentioned, the channel-to-floating gate coupling experienced by a selected storage element depends on a data pattern of neighboring storage elements. If both adjacent storage elements on the same word line are unselected, the coupling will be greater than if only one adjacent storage element is on the same word line, or if the closest unselected storage element is non-adjacent to the selected storage element. By sensing the actual coupling experienced by each selected bit line, an informed decision can be made regarding whether or not to provide compensation, and/or a level of compensation to provide. U.S. Pat. No. 7,215,574, incorporated herein by reference, provides a Vbl offset as a function of whether one or both neighbor bit lines are locked out. A sense amp for a given bit line receives control signals from sense amps of the left and right side neighbor bit lines to determine if they are locked out. However, this approach requires additional circuitry and layout area to allow the sense amps to communicate with one another. A solution provided herein overcomes these drawbacks.

In one approach, the voltages of unselected bit lines are stepped up to induce coupling to any neighboring selected bit lines, and the selected bit lines are sensed to determine the amount of coupling. If the amount of coupling exceeds a threshold, data is stored in a latch or other location that indicates the selected bit line should receive compensation by raising the Vbl by a specified amount during programming. The compensation can be applied to slow and/or fast programming mode bit lines.

In an example process, a programming operation begins at step 1700. An iteration of the programming operation begins at step 1702. Step 1704 includes stepping up voltages of unselected bit lines while floating the selected bit lines. Control circuits can read latches of the bit lines to determine which are unselected, and instruct the sense circuits to raise the Vbl. Similarly, control circuits can read latches of the bit lines to determine which are selected, and instruct the sense circuits to float the bit line. Step 1706 includes sensing the voltage on selected bit lines to determine the extent of coupling from the unselected bit lines. Any type of sensing technique can be used, including voltage or current sensing. Step 1708 includes identifying each selected bit line as needing compensation or not needing compensation. This information can be stored in latches of the sense circuit or another location. A threshold level (T) of coupling which requires compensation may be based on an amount of coupling which is realized when one or more adjacent bit lines of a selected bit line are unselected.

Step 1710 includes providing compensation for the selected bit lines which need compensation by raising their voltage above a baseline level. In one approach, three situations are considered: (1) both adjacent bit lines inhibited, (2) only one adjacent bit line inhibited, or (3) no adjacent bit line inhibited. A bit line bias is provided for each situation. For example, 0.5 V, 0.25 V and 0 V may be used for the first, second and third cases, respectively. For a fast programming mode, where Vfast is nominally 0 V, we have Vfast+comp=Vcomp=0.5 V, 0.25 V or 0 V for the first, second and third cases, respectively. For a slow programming mode, where Vslow is nominally 0.6 V, we have Vslow+comp=1.1 V, 0.85 V or 0.6 V for the first, second and third cases, respectively.

Step 1712 includes applying a program pulse to the selected storage elements with the compensation provided. Step 1714 includes performing a verify operation for the selected bit lines. Step 1716 includes locking out bit lines which reach a target data state.

At decision step 1718, if there is a next programming iteration, processing continues at step 1702. If there is no next programming iteration, the programming operation ends at step 1720.

Figure 17B:
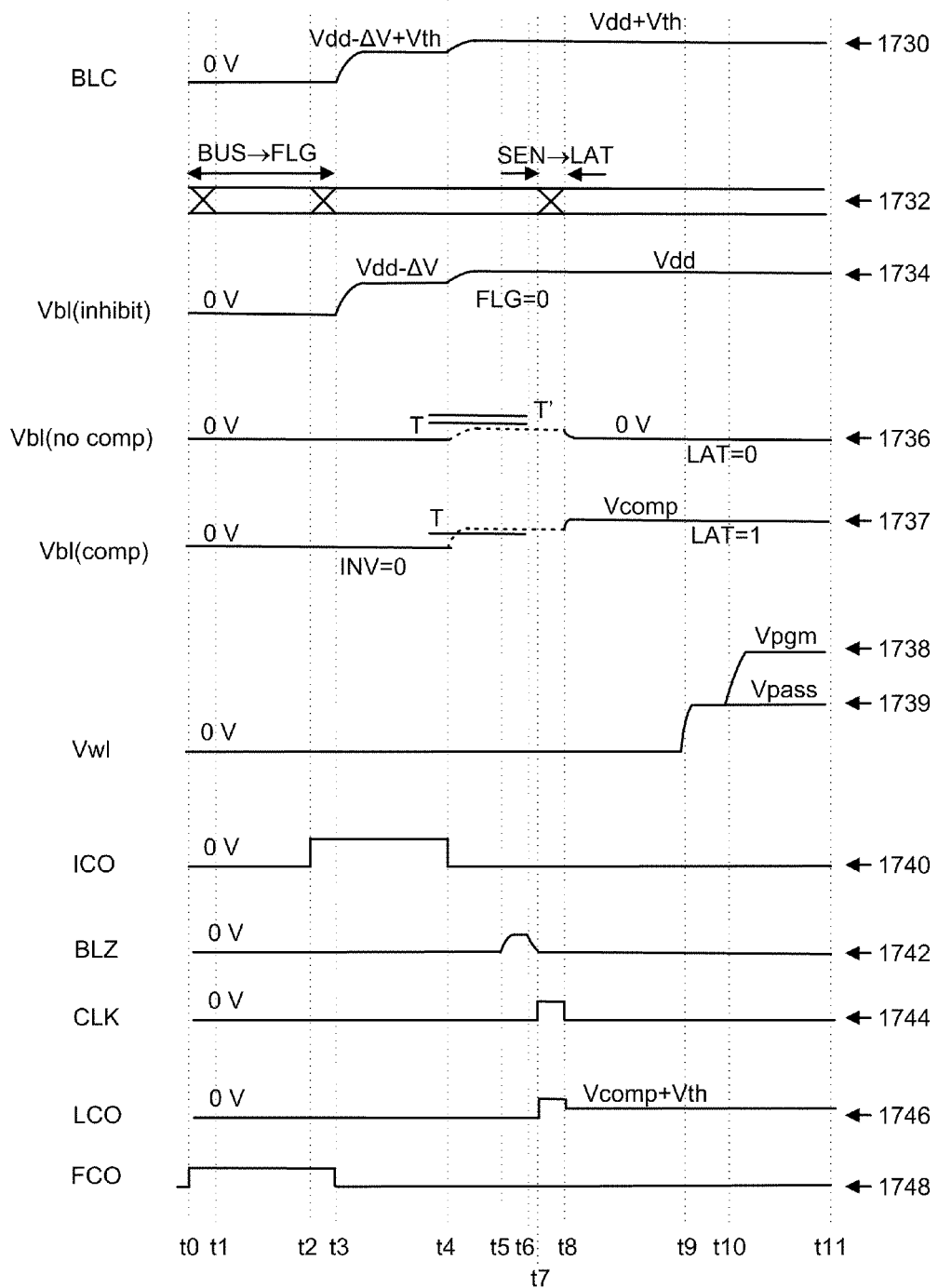

As an example, the process of FIG. 17a is explained further with reference to the sense circuit of FIG. 16a and the time lines of FIGS. 17b and 17c.

FIG. 17b depicts a time line for sensing and programming which is associated with the sensing circuit of FIG. 16a. Note that the drawings in the various figures herein are not necessarily to scale or in proportion to one another. This is an example of controlling the sense circuit 1699 to sense whether compensation is needed and to provide such compensation such as via the LCO transistor 1618 (the BLC transistor is only a pass gate). The time lines depict voltages of inhibited bit lines and selected bit lines. Waveforms are provided for like-named components in the sense circuit of FIG. 16a. In this case, Vbl (waveforms 1734, 1736 and 1737) is not floated when Vpgm is applied. However, both slow and fast programming modes are not provided.

Waveform 1730 represents the gate voltage of the BLC transistor. Waveform 1732 represents a data transfer from the BUS 1624 to the FLG path 1629 and from the SEN to the LAT path 1621. Waveform 1734 represents Vbl for inhibited bit lines (Vbl(inhibit)). Waveform 1736 represents Vbl for selected bit lines, (Vbl(no comp)), where compensation (comp) is determined by sensing to not be needed. In this case, LAT=0. Waveform 1737 represents Vbl for selected bit lines (Vbl(comp)) where compensation is determined by sensing to be needed. In this case, LAT=1. Waveform 1738 represents the voltage applied to a selected word line. Waveform 1739 represents the voltage applied to an unselected word line. Waveform 1742 represents a voltage applied to a gate of the BLZ transistor, to determine the charge sharing between the SEN node and the coupled bit line for sensing from t5-t6. Waveform 1744 represents a voltage applied to the CLK node 1608, where it is stepped up to enhance the SEN node for sensing. Waveform 1746 represents a voltage applied to a gate of the LCO transistor, to cause the SEN to LAT data transfer from t7-t8. Waveform 1748 represents a voltage applied to a gate of the FCO transistor, to cause the BUS to FLG data transfer from t0-t3.

After the BUS to FLG data transfer at t0-t3, BLC rises at t3 to Vdd−ΔV+Vth. As a result, Vbl(inhibit) rises to Vdd−ΔV. At t4, BLC rises by ΔV, to Vdd+Vth. As a result, Vbl(inhibit) rises to Vdd. As discussed, the voltage step up in the inhibited bit lines couples to the selected bit lines, which are floating, increasing their voltage as well, based on ΔV and a coupling ratio. For example, waveform 1736 provides a case where Vbl is coupled to a level which is below a threshold T, while waveform 1737 provides a case where Vbl is coupled to a level which is above the threshold T. Regarding waveform 1736, T' is an example of a second threshold which could be used. It is possible to sense whether different threshold levels of coupling have been experienced by a selected bit line, in which case corresponding different levels of compensation can be provided, e.g., more compensation when there is more coupling. For example, a lower threshold of coupling (T) may correspond to only one adjacent unselected bit line, in which case a first bit line bias is applied during programming, and a higher threshold of coupling (T') may correspond to two adjacent unselected bit lines, in which case a higher, second bit line bias is applied during programming.

The different compensation voltages are supplied through the sense circuits and more latch circuits similar to LAT latch 1619 and LCO transistor 1618 may be required. For simplicity, the circuits illustrated in FIG. 16a can not provide more than one compensation voltage. In contrast, the circuit and time line illustrated in FIGS. 14 and 15 can provide a continuous compensation voltage covering a voltage range from 0 to a maximum voltage required to achieve full compensation. The method provided in FIG. 17c, discussed further below, provides more controlled and digitized compensation without uncontrolled coupling during programming.

The dashed lines represent a floating voltage. The BLZ transistor is opened for sensing from t5-t6. Bit lines which couple up above T are latched with LAT=H (high), and bit lines which do not couple up above T are latched with LAT=0 (low). The update of the LAT path 162 in FIG. 16a is achieve via HLL 1606, ISO 1617 and LCO 1618 which is different from the STR (strobe) path 1615 to prevent the data polarity flipping.

The sensing can use a technique which determines whether charge sharing occurs between the SEN node 1611 in connection with capacitor 1609 and a capacitance of the bit line, for instance. The voltage of the capacitor will change or not change based on the BLZ transistor being ON or OFF, respectively. If the bit line level is lower than the threshold (T) set by BLZ transistor (T+Vth), then the SEN node, which has a small capacitance, will be at the same level as the bit line voltage. If the bit line voltage is higher than the T threshold, then SEN will be left at Vdd, its pre-charged level. In one possible approach, the BLZ transistor 1610, or another transistor, can be provided with a gate voltage of T+Vth so that the BLZ transistor is conductive when the Vbl with bit line-to-bit line coupling is less or equal to T, or non-conductive when the Vbl with bit line-to-bit line coupling is greater than T. Capacitor 1609 is initially charged up to Vdd. For example, if T=0.8 V, we can bias the BLZ transistor with 0.8 V plus the Vth (e.g., 1 V) of the transistor, for a total of 1.8 V. If the bit line is coupled up to 0.9 V, the BLZ transistor cuts off the bit line from the sense circuit (since 1.8-1.0<0.9). When the sense node 1611 is charged up to a voltage such as Vdd, that voltage will remain because the BLZ transistor is non-conductive. It can be determined that the BLZ transistor is non-conductive when the voltage of the capacitor does not drop significantly. On the other hand, if the bit line is coupled up to 0.7 V, the BLZ transistor will be conductive so that the bit line can communicate with the sense circuit (since 1.8-1.0>0.7), and the sense node voltage will drop significantly to equal to Vbl, since the bit line capacitance is much higher than that of the capacitor 1609.

At t8, the bit lines which do not require compensation are pulled to ground (waveform 1736), and the bit lines which do require compensation are pre-charged at a specified compensation level (waveform 1737) by providing the control gate of LCO transistor at Vth+ the compensation level. Thus, when Vpgm is applied, potentials of the respective bit lines of the selected non-volatile storage elements which are not coupled up to the threshold T are provided at one level, e.g., 0 V (waveform 1736), and potentials of the respective bit lines of the selected non-volatile storage elements which are coupled up to the threshold T are provided at another, higher level, e.g., Vcomp (waveform 1737).

Vpass is applied to the word lines at t9, and Vpgm is applied to the selected word line at t10. The bit lines are not floating when Vpgm is applied, but are advantageously provided at specified levels. In this approach, a selected bit line is referred to generally, and may be, e.g., a fast programming mode bit line when no slow programming mode is used. When Vpgm is applied, Vbl is advantageously at 0 V (waveform 1736) when no compensation is needed, and at a specified non-zero level (waveform 1737) when compensation is needed.

FIG. 17*c* depicts a time line for sensing which is associated with the sensing circuit of FIG. 16*a*. This is another example of controlling the sense circuit 1699 of FIG. 16*a* to sense whether compensation is needed and to provide such compensation such as via the LCO transistor 1618. The time lines include voltages of inhibited bit lines, fast programming bit lines with and without compensation, and slow programming bit lines with and without compensation. This embodiment leaves V(slow+comp) floating (waveform 1762), while all three other voltages are actively biased, e.g., at 0 V, Vslow and Vcomp (=Vfast+comp=0 V). This is an example of a design tradeoff in selecting which bit lines will be driven and which will be floated when the sense circuit does not allowing driving all bit lines at different levels. In particular, the technique selects to drive the slow programming mode bit lines when compensation is not indicated and to float them when compensation is indicated. The technique also selects to drive the fast programming mode bit lines at one level regardless of whether compensation is needed or not. FIG. 17*d*, discussed further below, provides an alternative technique.

Note that compensation can be indicated by sensing, as discussed in an example implementation, or by other means. For instance, the location of selected and unselected bit lines may be known from control data. U.S. Pat. No. 7,215,574, discussed previously, provides one possible approach, where sense amps exchange control data which indicates whether a bit line is selected or unselected. Another approach is to have a central control provide data to each sense circuit which directly sets a compensation level, or no compensation, based on the central control's knowledge of the proximity of unselected bit lines to each selected bit line.

The latch conditions are as follows for four bit line cases. In a first case, for an inhibited bit line (waveform 1754), FLG=0 and LAT=1. In a second case, for a compensated bit line (waveform 1758 or 1762), FLG=1 and LAT=1. LCO will be at Vslow+comp+Vth for the slow programming mode bit lines with compensation. The bit lines are charged from t8-t9. In a third case, for Vbl(slow) (waveform 1760), FLG=1 and LAT=1. LCO will be at Vslow+Vth for a slow programming mode bit line when the bit lines are charged after t10. At this time, the compensated bit line either gets discharged over a discharge period to 0 V or remains at a compensated level (waveform 1758) or is slightly coupled up to Vslow+comp+ (waveform 1762). In a fourth case, for a grounded bit line (waveform 1756), FLG=1 and LAT=0.

Waveform 1750 represents the gate voltage of the BLC transistor. Waveform 1752 represents data transfers from the BUS 1624 to the FLG path 1629 from t0-t3, from the SEN node 1611 to the LAT path 1621 from t7-t8, and from the BUS 1624 to the LAT path 1621 from t9-t10. Waveform 1754 represents Vbl(inhibit). Waveform 1756 represents Vbl(fast) where compensation is not indicated by sensing. In this case, LAT=0. Waveform 1758 represents Vbl for fast programming mode bit lines (Vbl(fast+comp)=0 V) where the need for compensation is indicated by sensing, but the compensated voltage gets discharged when the LAT is updated the second time for the case where the Vth is far from the target Vth. Waveform 1760 represents Vbl for slow programming mode bit lines (Vbl(slow)) where compensation is not indicated by sensing. Vbl(slow)=Vslow from t10-t13 by setting the LCO gate to Vslow+Vth. Waveform 1762 represents Vbl for selected slow programming mode bit lines (Vbl(slow+comp)) where the need for compensation is indicated by sensing.

Waveform 1764 represents the voltage applied to a selected word line. Waveform 1766 represents the voltage applied to an unselected word line. Waveform 1767 represents the voltage applied to the HLL transistor 1606. Waveform 1768 represents a voltage applied to a gate of the ICO transistor to hold the non-inhibited bit lines to ground with FLG set to Vdd. Waveform 1770 represents a voltage applied to a gate of the BLZ transistor, to discharge the capacitor 1609 for sensing from t5-t6. Waveform 1772 represents a voltage applied to the CLK node 1608 to boost up the SEN node to update LAT. Waveform 1774 represents a voltage applied to a gate of the LCO transistor. From t7-t8, LCO cause the BUS to LAT data transfer. From t8-t13, LCO is set to provide a desired Vbl. For example, LCO is set at a level for compensating programming mode bit lines. Waveform 1776 represents a voltage applied to a gate of the FCO transistor, to cause the BUS to LAT data transfer when FCO is high.

After the BUS to FLG data transfer at t0-t3, BLC rises at t3 to Vdd−ΔV+Vth. As a result, Vbl(inhibit) rises to Vdd−ΔV. At t4, BLC rises by ΔV, to Vdd+Vth. As a result, Vbl(inhibit) rises to Vdd. The voltage rise in the inhibited bit lines couples to the selected bit lines Vbl(fast+comp) and Vbl(slow+comp), which are floating, increasing their voltage, based on ΔV and a coupling ratio. A small amount of coupling to Vbl(fast) which does not exceed a threshold is shown as an example. Also as an example, essentially no coupling affects Vbl (slow). The dashed lines represent a floating voltage. HLL is high from t4 to t5 to pre-charge the SEN node to Vdd. The BLZ transistor is opened (made conductive) for sensing from t5-t6, and HLL is high from t7-t8 to cause the SEN to LAT transfer to set latch 1619.

At t8, the Vbl(fast) bit lines, for which compensation is not indicated, are pulled to ground (waveform 1756). At t8-t9, the bit lines 1758 and 1762 are pre-charged at specified levels while the Vbl(slow) bit lines are grounded (waveform 1760). LCO is set at Vslow+comp+Vth to provide Vbl(slow+comp) =Vslow+comp. From t9-t10, LCO steps down to Vdd+Vth (>Vslow+Vth) to perform the data transfer from BUS to LAT. At t10, Vbl(fast+comp) is also discharged to ground, and Vbl(slow)=Vslow since LCO=Vslow+Vth. Note that the increase in Vbl(slow) couples up Vbl(slow+comp) at t10.

For example, as discussed, Vbl(slow+comp) can be 1.1 V, 0.85 V or 0.6 V with (1) both adjacent bit lines inhibited, (2) one adjacent bit line inhibited, or (3) no adjacent bit line inhibited, respectively.

Vpass is applied to the word lines at t11, and Vpgm is applied to the selected word line at t12. In this case, the Vbl(slow+comp) bit lines are floating when Vpgm is applied, while the other bit lines are not.

Thus, when Vpgm is applied, Vbl(fast), which does not couple up to the threshold T, is provided at 0 V, Vbl(slow), which does not couple up to the threshold T, is provided at Vslow, and Vbl(slow+comp), which does couple up to the threshold T, is provided at Vslow+comp or Vslow+comp+. Vslow+comp+ represents coupling up from Vslow+comp due to Vbl(slow) stepping up from 0 V to Vslow (waveform 1760) at t10. This coupling up is data pattern specific.

FIG. 17d depicts another time line for sensing which is associated with the sensing circuit of FIG. 16a. This is another example of controlling the sense circuit 1699 of FIG. 16a to sense whether compensation is needed and to provide such compensation. The time lines include voltages of inhibited bit lines, fast programming bit lines with and without compensation, and slow programming bit lines with and without compensation. This embodiment leaves the inhibited bit lines floating, while three other voltages are actively biased (e.g., at 0 V, Vbl(slow) and Vbl(slow+comp).

This is another example of a design tradeoff in selecting which bit lines will be driven and which will be floated when the sense circuit does not allowing driving all bit lines at different levels. In particular, the design selects to drive the slow programming mode bit lines at one level when compensation is not indicated, and at another level when compensation is indicated. The technique also selects to drive the fast programming mode bit lines at one level. The technique floats Vbl(inhibit).

The following steps apply: (a) sense the floating bit lines, and latch the sensed result in FLG instead of LAT. LAT is updated with the slow program information from BUS. The isolation transistor ISO 1617 is used to isolate the data transfer operation between BUS and LAT from the bit line charging operation so that two operations can be concurrently executed. (b) Update the SEN node with the LAT data by opening (making conductive) the HLL and LCO transistors. (c) Lower BLC to Vslow+comp+Vth for slow programming mode bit lines, set LCO=Vslow+Vth, and charge the bit lines to the voltage. (d) Start to ramp the word line voltages to perform programming.

The latch condition for four bit line cases is as follows. In a first case, for inhibited bit lines (waveform 1782), FLG=0 and LAT=1 and the inhibited bit lines are charged up to Vdd between t4 and t8. In a second case, for compensated bit lines (waveforms 1784 and 1786), FLG=0 and LAT=1 after t8. After t8, BLC=Vslow+comp+Vth for slow programming mode bit lines with compensation. In a third case, for slow programming mode bit lines without compensation (waveform 1785), FLG=1 and LAT=1. LCO=Vslow+Vth for slow programming mode bit lines without compensation. The bit lines are charged after t10. At this time, the compensated bit lines get discharged to 0 V and the inhibited bit line gets slightly coupled up. Both the slow program and the slow+comp bit lines are actively biased to avoiding coupling. In a fourth case, for grounded bit lines (waveform 1783), FLG=1 and LAT=0.

Waveform 1780 represents the gate voltage of the BLC transistor. Waveform 1781 represents data transfers from the BUS 1624 to the FLG path 1629 from t0-t3, from the BUS to the LAT path from t5-t6, and from the SEN node to the FLG path from t7-t8. Using similar waveform names as FIG. 17c, waveform 1782 represents Vbl(inhibit), waveform 1783 represents Vbl(fast), where LAT=0, waveform 1784 represents Vbl(fast+comp) and waveform 1785 represents Vbl(slow). Vbl(slow)=Vslow after t8 by setting the LCO gate to Vslow+Vth. Waveform 1786 represents Vbl(slow+comp).

Waveform 1787 represents the voltage applied to a selected word line. Waveform 1788 represents the voltage applied to an unselected word line. Waveform 1789 represents the voltage applied to the STR transistor 1615. Waveform 1790 represents a voltage applied to a gate of the HLL transistor. Waveform 1791 represents a voltage applied to a gate of the ISO transistor. Waveform 1792 represents a voltage applied to a gate of the ICO transistor. Waveform 1793 represents a voltage applied to a gate of the BLZ transistor, to discharge the capacitor 1609 for sensing from t5-t6. Waveform 1794 represents a voltage applied to the CLK node 1608. Waveform 1795 represents a voltage applied to a gate of the LCO transistor. From t5-t6, LCO cause the BUS to LAT data transfer. From t9-t13, LCO is set to provide a desired Vbl. Waveform 1796 represents a voltage applied to a gate of the FCO transistor, to cause the BUS to FLG and SEN to FLG data transfers when FCO is high.

After the BUS to FLG data transfer at t0-t3, BLC rises at t3 to Vdd−ΔV+Vth. As a result, Vbl(inhibit) rises to Vdd−ΔV. At t4, BLC rises by ΔV, to Vdd+Vth. As a result, Vbl(inhibit) rises to Vdd. The voltage rise in the inhibited bit lines couples to the selected bit lines Vbl(fast+comp) and Vbl(slow+comp), which are floating, increasing their voltage, based on ΔV and a coupling ratio. A small amount of coupling to Vbl(fast) which does not exceed a threshold is shown as an example. Also as an example, essentially no coupling affects Vbl (slow). The dashed lines represent a floating voltage. The BLZ transistor is opened for sensing from t5-t6. HLL and ISO go high from t6-t7 to update the SEN node from the LAT latch. STR is high from t7-t8 to cause the SEN to FLG transfer. During the latch updates BUS→FLG, BUS→LAT, and SEN→FLG, the reverse connected inverters 1622 and 1632 (FIG. 16a) are disabled to avoid fighting. During the SEN update from the LAT 1619, the reverse connected inverter 1622 is active to make sure the LAT will overwrite SEN in the case of LAT=0.

At t8, for a slow programming mode bit line with compensation, BLC is set at Vslow+comp+Vth so that Vslow+comp is provided at waveform 1786. For a fast programming mode bit line with compensation, the bit line is discharged to ground through LAT=0. LCO is set at Vslow+Vth so that Vslow is provided at waveform 1785. The Vbl(fast) bit lines, for which compensation is not indicated, are pulled to ground (waveform 1783). Vbl(inhibit) (waveform 1782) may be coupled up to a level Vdd+, which is greater than Vdd, due to the step up in Vbl(slow) (waveform 1785) and Vbl(slow+comp) (waveform 1786) at t8.

Vpass is applied to the word lines at t11, and Vpgm is applied to the selected word line at t12. In this case, the Vbl(inhibit) bit lines are floating when Vpgm is applied, while the other bit lines are not.

Note that the techniques of the time lines of FIGS. 16b, 17b-d, which related to the sense circuit of FIG. 16a, could be modified if FIG. 16a were modified to include power supplies at Vdd−ΔV and Vdd, as in FIG. 14. In this case, BLC can be set high to pass Vdd−ΔV and Vdd to the bit line rather than clamping the bit line voltage using BLC.

Figure 18A:
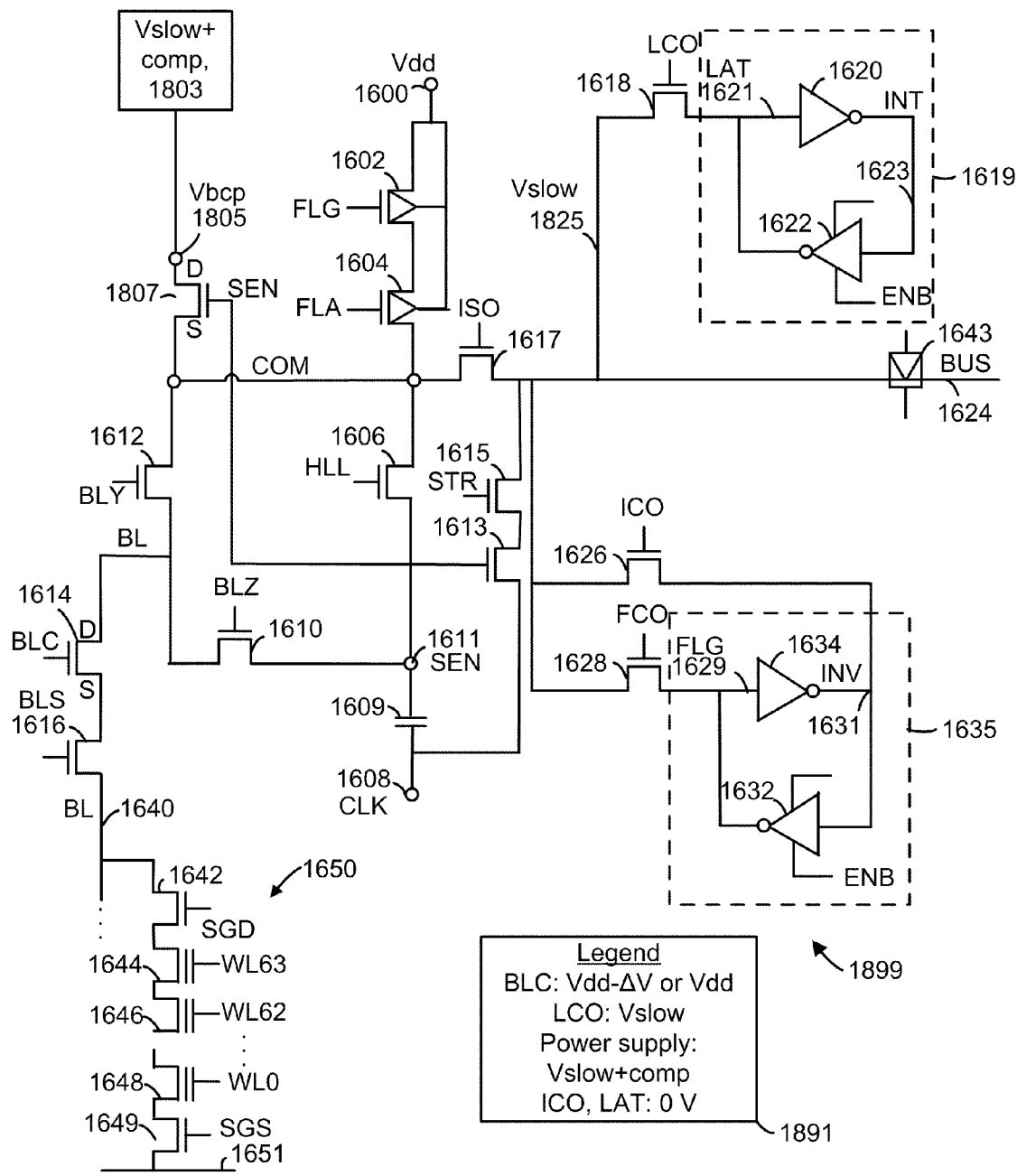
FIG. 18a depicts another alternative sensing circuit.

FIG. 18a depicts another alternative sensing circuit 1899. In this circuit, a drive voltage is used for slow programming mode bit lines with compensation. A similar double voltage drive technique can also be realized in the sensing circuit shown in FIG. 14. The sense circuit 1899 is the same as the circuit of FIG. 16a except for the addition of a transistor 1807, power supply node 1805, and a power supply 1803, which provides an output at Vslow+comp. Vcomp could be adjustable, e.g., from 0.2-0.6 V, and Vslow could be adjustable, e.g., from 0.2-0.8 V, so that Vslow+comp is adjustable from 0.4-1.4 V. Like-numbered elements in FIG. 18a correspond to the elements in FIG. 16a.

By driving the selected bit lines using one or more power supplies, the level can be precisely set compared to techniques which float the bit line. The power supply 1803 can be coupled to the bit line so that the selected bit line is driven at a specified level of Vslow+comp, which provides an appropriate Vbl for the slow programming mode in addition to compensating for channel-to-floating gate coupling.

Additionally, for a slow programming mode bit line without compensation, Vslow can be provided to the bit line by applying Vslow+Vth to the LCO transistor 1618 so that Vslow is provided on path 1825 and coupled to the bit line. Another option is to connect Vcomp from another power supply in addition to Vslow on path 1825 to the bit line, instead of connecting power supply 1803 to the bit line. See legend 1891, which indicates which components are used to set which voltages. By appropriate control of the sense circuit 1899, the bit line 1640 and the channel of the NAND string 1650, representing a selected NAND string, can be driven directly by the power supply Vslow+Vcomp. In this case, precise control of the bit line can be provided without risk of floating the bit line.

The sensing circuit can be operated as follows to provide four voltage supplies.

a) Transfer lockout data into the FLG latch 1635.

b) Pre-charge the bit lines to Vdd−ΔV (controlled by BLC voltage) if FLG=0 for inhibit bit lines; other bit lines are solid GND as ICO=H (high) to pull down through INV.

c) Turn off ICO to float the bit lines with FLG=1; increase BLC voltage to pass Vdd.

d) After the bit lines couple up; turn on BLZ to perform voltage sensing and store the result on the SEN node with the capacitor. The sensing result gets boosted by the CLK node to make sure it is high enough to set LAT to high for the compensation case.

e) The sensing result is transformed from an analog voltage to digital level at LAT. The digitized voltage is transferred back to SEN node and stored for future use. Thus, the sensed voltages of the selected bit lines are sensed, digitized and stored, and voltages of the selected bit lines are subsequently provided at respective levels which are based on the sensing, and responsive to the stored data, when Vpgm is applied.

Provide coupling compensation if LAT=1; do not provide coupling compensation if LAT=0. Use the capacitor 1609 to hold the data.

f) Transfer the lockout1 data from data latches to LCO latch through BUS.

g) Turn on HLL to update SEN node only when LAT=0.

h) Vbcp node 1805 changes from floating to a bias voltage to supply a compensation voltage Vcomp+Vslow. Vslow can be provided by LCO.

i) Four different bit line voltages are supplied to bit lines actively (at 0 V, Vslow, Vslow+comp and Vdd), where each bit line is biased to one of the four voltages. Ramp the word line voltages to start programming.

Figure 18B:
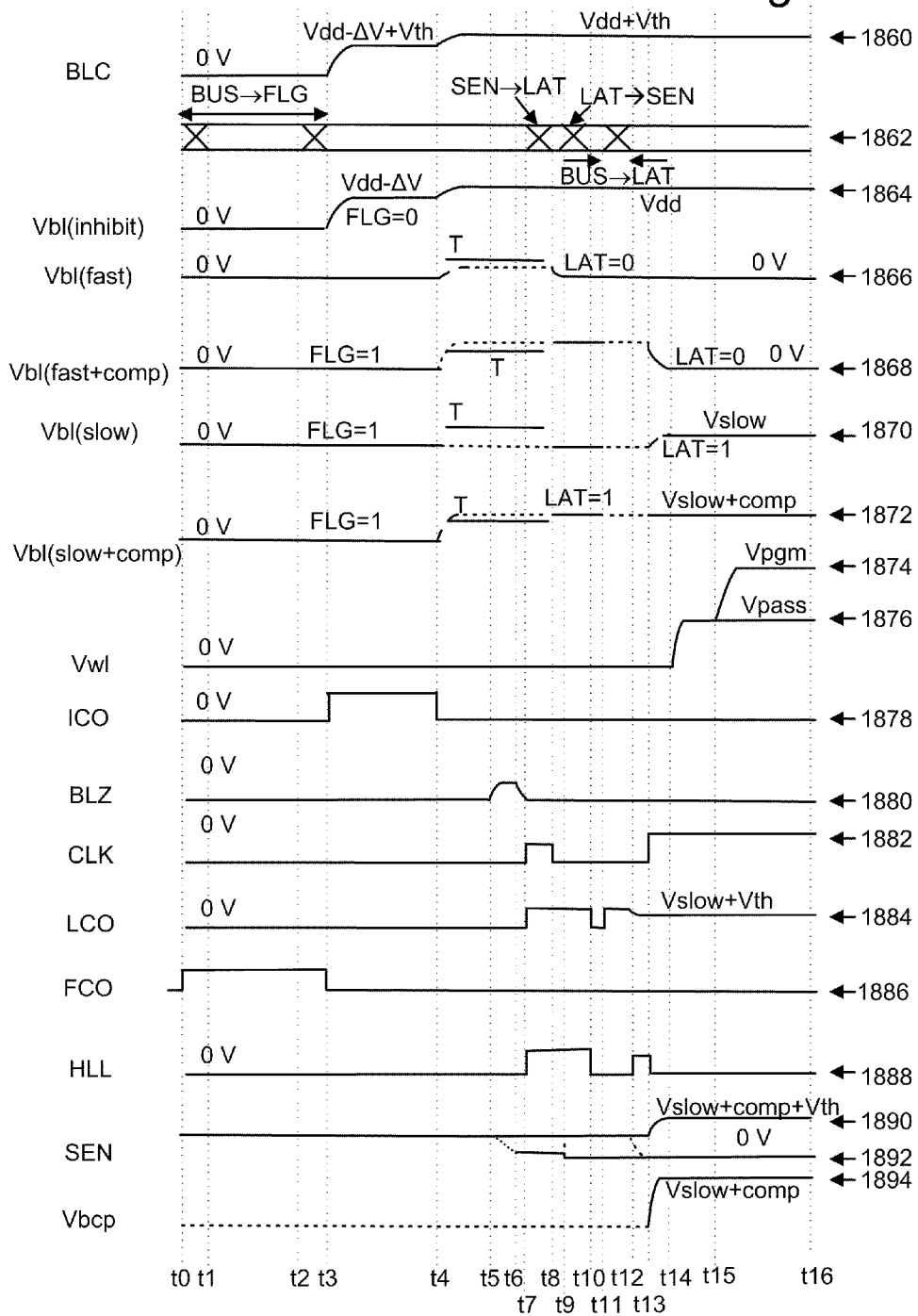

FIG. 18*b* depicts a time line for sensing and programming which is associated with the sensing circuit of FIG. 18*a*. This is an example of controlling the sense circuit 1899 to sense whether compensation is needed and to provide such compensation via dedicated power supplies to provide precise control. The time lines include voltages for inhibited bit lines, fast programming bit lines with and without compensation, and slow programming bit lines with and without compensation.

Generally, t0-t3 is a lockout period in which the bit lines are cutoff from the sense circuit, t3-t4 is a bit line pre-charge period, t4-t7 is a sense period in which coupling from neighbor bit lines is sensed, t7-t8, t9-t10 and t12-t13 are data transfer periods, and t13-t16 is a period in which bit lines are charged and programming occurs.

Waveform 1860 represents the gate voltage of the BLC transistor. Waveform 1862 represents a data transfer from the BUS 1624 to the FLG node 1629 between t0-t3, from the SEN node 1611 to the LAT node 1621 between t7-t8, from LAT node back to the SEN node to update SEN to a digital level between t9-t10 and from BUS 1624 to LAT node 1621 between t11-t12. Waveform 1864 represents Vbl(inhibited). Waveform 1866 represents Vbl(fast), where LAT=0. Waveform 1868 represents Vbl(fast+comp). Waveform 1870 represents Vbl(slow). Vbl(slow) is controlled by the BLC transistor from t13-t16. Waveform 1872 represents Vbl(slow+comp).

Waveform 1874 represents the voltage applied to a selected word line. Waveform 1876 represents the voltage applied to an unselected word line. Waveform 1878 represents a voltage applied to a gate of the ICO transistor. Waveform 1880 represents a voltage applied to a gate of the BLZ transistor, to discharge the capacitor 1609 for sensing from t5-t6. Waveform 1882 represents a voltage applied to the CLK node 1608. The CLK signal steps up during the bit line coupling sensing between t7-t9 and again is needed for boosting SEN so that transistor 1807 becomes conductive, passing Vbcp to the bit line. Waveform 1884 represents a voltage applied to a gate of the LCO transistor, to cause the SEN to LAT transfer from t7-t8, LAT to SEN transfer from t9-t10 and BUS to LAT transfer from t11-t12, and to supply the slow program voltage to bit line after t13. LCO=Vslow+Vth after t13 to provide Vslow to the bit line of a slow programming mode storage element, without compensation. Waveform 1886 represents a voltage applied to a gate of the FCO transistor, to cause the BUS to FLG data transfers when FCO is high. Waveform 1888 represents a voltage applied to a gate of the HLL transistor, first to transfer the sensed result from SEN to LAT latch and the LAT to SEN node during period t7-t10, and then discharge the SEN node if no compensation is needed when LAT=0 from t12-t13.

The HLL transistor is used to transfer data in and out of the SEN capacitor 1609. After transferring the sensed data from SEN to LAT, the LAT signal being latched is a digital signal, and is transferred over to the dynamic latch on the capacitor between t9-t10. By setting HLL high, Vdd is saved at SEN. If compensation is not needed, then the capacitor is at 0 V. If compensation is needed, the capacitor will store Vdd. The SEN node 1611 is connected to the capacitor and causes the transistor 1807 to become conductive to connect the node 1805 to the bit line, when SEN is high, or to causes the transistor 1807 to become non-conductive to disconnect the Vbcp node 1805 from the bit line, when SEN is low. The transistor 1807 has a drain connected to the node 1805 and the power supply 1803, a source connected to the bit line, and a gate connected to the sense node 1611. FLG will supply Vdd to the bit line when FLG=0.

From t12-t13, LAT will only supply Vslow and the power supply 1803 will supply Vslow+comp to the bit line.

The lockout1 transfer at t12-t13 indicates whether a bit line is in a slow programming mode. Here, LAT gets refreshed one more time with new data. At the end of the lockout1 transfer, at t12-t13, SEN gets refreshed again to discharge SEN to 0 for the case of fast+comp. The bit lines which receive Vslow still have LAT=1.

For inhibited bit lines, FLG=0, LAT=1 and SEN=1, where the transistor FLG 1602 supplies Vdd to bit line. For fast programming mode bit lines without compensation, FLG=1, LAT=0 and SEN=0, where the LAT latch 1619 supplies the ground to the bit line. For slow programming mode bit lines without compensation, FLG=1, LAT=1 and SEN=0, where the LAT latch 1619 supplies Vslow. For slow programming mode bit lines with compensation, FLG=1, LAT=1 and SEN=1, where SEN transistor 1807 supplies the Vslow+comp. LAT will only supply Vslow to the bit line through LCO transistor control.

Thus, we have three data latches holding data, namely FLG, LAT and the capacitor. Based on these three values, we can set the bit line voltages. After all the bit line voltages settle, boosting and programming are performed, starting at t13.

At the same time, LAT=0 V will also pull down the bit line to ground. So, refreshing the sense node to equal zero ensures that Vcomp will not be applied on the bit line. The compensated bit line only has to discharge to ground, but the discharge path is activated by LAT=0 V. For the discharge path, we have to go through an inverter or ground transistor, but the Vcomp supply 1803 is only a supply voltage. Even though the sense node may already be at 0 V, this does not guarantee the bit line will be discharged to zero, so the discharge has to go through the LAT transistor.

Note that the first and second HLL pulses have different amplitudes, but this is not necessary. A different amplitude might be used to pass Vdd when transfer the sense node to pass Vdd. But when SEN is just discharging to ground, a high voltage is not needed for HLL. For example, when passing Vdd, HLL only needs to be at Vdd+Vth. Usually Vth is about 1 V. If Vdd=2.5 V, then HLL=3.5 V. This can cause some stress on HLL, when it is a low voltage transistor. Switchable voltages can be used so that when we want to pass Vdd we can use 3.5 V on HLL, but if we only want to pass 0 V, we can use 2.5 V to reduce the stress on the HLL transistor.

Waveform 1890 represents a voltage at the SEN node when the SEN node is not discharged during sensing, and waveform 1892 represents a voltage at the SEN node when the SEN node is discharged during sensing or during updating. Waveform 1894 represents a voltage at the node 1805 in FIG. 18a, when Vbcp rises to Vslow+comp.

After the BUS to FLG data transfer at t0-t3, BLC rises at t3 to Vdd−ΔV+Vth. As a result, Vbl(inhibit) rises to Vdd−ΔV. Vbl(inhibit) is supplied by the FLG path 1629 with FLG=0. LAT=1 (high) at the same time. At t4, BLC rises by ΔV, to Vdd+Vth. As a result, Vbl(inhibit)=Vdd. The voltage rise in the inhibited bit lines couples to Vbl(fast+comp) and Vbl (slow+comp), which are floating, increasing their voltages, as a function of ΔV and a coupling ratio. A small amount of coupling to Vbl(fast) which does not exceed a threshold is shown as an example. Also as an example, essentially no coupling affects Vbl(slow). The dashed lines represent a floating voltage. The BLZ transistor is opened for sensing from t5-t6.

The Vbl(fast) bit lines, for which compensation is not indicated, are pulled to ground at t8 (waveform 1866), while the Vbl(fast+comp) bit lines, for which compensation is indicated, are pulled to ground at t13 (waveform 1868). The bit lines are pre-charged at specified levels at t13-t16). Regarding waveform 1870, when SEN=0 (low) due to significant discharging of the sense node in a discharge period of a sensing operation, this indicates that coupling is low so that compensation is not needed. Accordingly, SEN=low renders the transistor 1807 non-conductive, so that the power supply node 1805 is cutoff from the bit line. On the other hand, when SEN=high due to insignificant discharging of the sense node in the discharge period, this indicates that coupling is high so that compensation is needed. Accordingly, SEN is sufficiently high to render the transistor 1807 conductive, so that the power supply node 1805 is connected to the bit line. In the case of both SEN and LAT is high, there are two voltages supplied to the bit line. One is Vslow from the LCO path and the other from transistor 1807. Since the power supply Vbcp=Vslow+comp, which is higher than Vslow, the LCO transistor will be in the OFF (non-conductive) condition. In the end, there is only one power supply from Vbcp providing the bit line potential.

When SEN=low, LCO provides Vslow to the bit line. Regarding waveform 1872, SEN=1 (high) is set to make the transistor 1807 conductive, acting as a pass gate, so that the power supply node 1805 is coupled to the bit line. Regarding waveforms 1866 and 1868, SEN=0 (low) is set to make the transistor 1807 non-conductive, so that the power supply node 1805 is cutoff from the bit line. Also, LAT=0 and FLG=1. Vpass is applied to the word lines at t14, and Vpgm is applied to the selected word line at t15. Advantageously, there is no concern than the bit lines will float when Vpgm is applied. The bit lines are driven at specified levels for precise control, including slow programming modes with or without compensation.

Note that the techniques of the time line FIG. 18b, which related to the sense circuit of FIG. 18a, could be modified if FIG. 18a were modified to include power supplies at Vdd−ΔV and Vdd, as in FIG. 14. In this case, BLC can be set high to pass Vdd−ΔV and Vdd to the bit line rather than clamping the bit line voltage using BLC. Similarly, the sense circuits of FIGS. 14 and 16a could be modified to include the power supply at Vcomp, as in FIG. 18a.

In one embodiment, a storage system includes a set of storage elements, including at least one storage element which is to be programmed to a target data state, a respective bit line associated with each storage element, and one or more control circuits. The one or more control circuits, to perform a number of programming iterations of a programming operation for the set of storage elements: (a) apply program pulses to the set of storage elements, with the respective bit line of the at least one storage element grounded, until the at least one storage element reaches a verify level which is below a target verify level of a target data state of the at least one storage element, and (b) in response to the at least one storage element reaching the verify level which is below the target verify level of the target data state of the at least one storage element, apply program pulses to the set of storage elements, with the respective bit line of the at least one storage element floated, until the at least one storage element reaches the target verify level of the target data state.

In another embodiment, a method for programming a set of storage elements in a storage system is provided, where each storage element is associated with a respective bit line. The method includes performing a number of programming iterations of a programming operation for the set of storage elements, wherein the storage elements in the set include at least one storage element which is to be programmed to a target data state. The performing of the number of programming iterations includes: (a) applying program pulses to the set of storage elements, with the respective bit line of the at least one storage element grounded, until the at least one storage element reaches a verify level which is below a target verify level of a target data state of the at least one storage element, and (b) in response to the at least one storage element reaching the verify level which is below the target verify level of the target data state of the at least one storage element, applying program pulses to the set of storage elements, with the respective bit line of the at least one storage element floated, until the at least one storage element reaches the target verify level of the target data state.

In another embodiment, a storage system includes a set of storage elements, including at least one storage element which is to be programmed to a target data state, a respective bit line associated with the at least one storage element, and one or more control circuits. The one or more control circuits: (a) program the set of storage elements, with the respective bit line grounded, until the at least one storage element reaches a verify level which is below a target verify level of a target data state of the at least one storage element, and (b) in response to the at least one storage element reaching the verify level which is below the target verify level of the target data state of the at least one storage element, continue programming the set of storage elements, with the respective bit line floated.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A storage system, comprising:
  a set of storage elements, including at least one storage element which is to be programmed to a target data state;
  a respective bit line associated with each storage element; and
  one or more control circuits, the one or more control circuits, to perform a plurality of programming iterations of a programming operation for the set of storage elements:
    (a) apply program pulses to the set of storage elements, with the respective bit line of the at least one storage element grounded, until the at least one storage element reaches a verify level which is below a target verify level of a target data state of the at least one storage element, and (b) in response to the at least one storage element reaching the verify level which is below the target verify level of the target data state of the at least one storage element, apply program pulses to the set of storage elements, with the respective bit line of the at least one storage element floated, until the at least one storage element reaches the target verify level of the target data state.

2. The storage system of claim 1, wherein:
  in response to the at least one storage element reaching the verify level which is below the target verify level of the target data state of the at least one storage element, the one or more control circuits apply the program pulses to the set of storage elements, with the respective bit line of the at least one storage element floated after the respective bit line of the at least one storage element is raised to a level which is associated with a slow programming mode.

3. The storage system of claim 1, wherein:
  the verify level which is below the target verify level of the target data state of the at least one storage element, is an offset verify level of the target data state of the at least one storage element.

4. The storage system of claim 1, wherein:
  the verify level which is below the target verify level of the target data state, is a target verify level of a lower data state than the target data state of the at least one storage element.

5. The storage system of claim 4, wherein:
  the lower data state is only one data state lower than the target data state of the at least one storage element.

6. The storage system of claim 4, wherein:
  the lower data state is more than one data state lower than the target data state of the at least one storage element.

7. The storage system of claim 1, wherein:
  the one or more control circuits lock out the at least one storage element from further programming when the at least one storage element reaches the target verify level of the target data state.

8. The storage system of claim 1, further comprising:
  at least one latch which stores data associated with the at least one storage element, and which indicates whether the at least one storage element should be programmed with its respective bit line grounded or floated.

9. The storage system of claim 1, wherein:
  the respective bit line of the at least one storage element, when floated, is coupled higher by a stepped up voltage on at least one adjacent unselected bit line, so that programming of the at least one storage element is slowed.

10. The storage system of claim 1, wherein:
  the set of storage elements is in a memory array which includes a set of word lines; and
  in connection with at least one of the program pulses in which the respective bit line of the at least one storage element is floated, the one or more control circuits raise a pass voltage on unselected word lines in the set of word lines before the respective bit line starts to float.

11. The storage system of claim 1, wherein:
  the set of storage elements is in a memory array which includes a set of word lines; and
  in connection with at least one of the program pulses in which the respective bit line of the at least one storage element is floated, the one or more control circuits raise a pass voltage on unselected word lines in the set of word lines after the respective bit line starts to float.

12. The storage system of claim 1, wherein:
  the set of storage elements is in a memory array which includes a set of word lines;
  a drain select transistor is provided between the at least one storage element and the respective bit line; and
  in connection with at least one of the program pulses in which the respective bit line of the at least one storage element is floated, the one or more control circuits raise a pass voltage on unselected word lines in the set of word lines, and step up a gate voltage of the drain select transistor after a specified delay relative to when the pass voltage is raised.

13. The storage system of claim 1, wherein:
  a drain select transistor is provided between the at least one storage element and the respective bit line; and
  in connection with at least one of the program pulses in which the respective bit line of the at least one storage element is floated, the one or more control circuits step up a gate voltage of the drain select transistor after the respective bit line starts to float.

14. The storage system of claim 1, wherein:
  a drain select transistor is provided between the at least one storage element and the respective bit line; and
  in connection with at least one of the program pulses in which the respective bit line of the at least one storage element is floated, the one or more control circuits step up a gate voltage of the drain select transistor before the respective bit line starts to float.

15. A method for programming a set of storage elements in a storage system, each storage element is associated with a respective bit line, the method comprising:
  performing a plurality of programming iterations of a programming operation for the set of storage elements, wherein the storage elements in the set include at least one storage element which is to be programmed to a target data state;

the performing the plurality of programming iterations includes:
  applying program pulses to the set of storage elements, with the respective bit line of the at least one storage element grounded, until the at least one storage element reaches a verify level which is below a target verify level of a target data state of the at least one storage element; and
  in response to the at least one storage element reaching the verify level which is below the target verify level of the target data state of the at least one storage element, applying program pulses to the set of storage elements, with the respective bit line of the at least one storage element floated, until the at least one storage element reaches the target verify level of the target data state.

16. The method of claim 15, wherein:
in response to the at least one storage element reaching the verify level which is below the target verify level of the target data state of the at least one storage element, the program pulses are applied to the set of storage elements, with the respective bit line of the at least one storage element floated after the respective bit line of the at least one storage element is raised to a level which is associated with a slow programming mode.

17. The method of claim 15, wherein:
the verify level which is below the target verify level of the target data state of the at least one storage element, is an offset verify level of the target data state of the at least one storage element.

18. The method of claim 15, wherein:
the verify level which is below the target verify level of the target data state, is a target verify level of a lower data state than the target data state of the at least one storage element.

19. The method of claim 18, wherein:
the lower data state is only one data state lower than the target data state of the at least one storage element.

20. The method of claim 18, wherein:
the lower data state is more than one data state lower than the target data state of the at least one storage element.

21. The method of claim 15, further comprising:
locking out the at least one storage element from further programming when the at least one storage element reaches the target verify level of the target data state.

22. The method of claim 15, further comprising:
providing latch data associated with the at least one storage element which indicates whether the at least one storage element should be programmed with its respective bit line grounded or floated.

23. The method of claim 15, wherein:
the respective bit line of the at least one storage element, when floated, is coupled higher by a stepped up voltage on at least one adjacent unselected bit line, thereby slowing programming of the at least one storage element.

24. The method of claim 15, wherein:
the set of storage elements is in a memory array which includes a set of word lines; and
in connection with at least one of the program pulses in which the respective bit line of the at least one storage element is floated, a pass voltage is raised on unselected word lines in the set of word lines before the respective bit line starts to float.

25. The method of claim 15, wherein:
the set of storage elements is in a memory array which includes a set of word lines; and
in connection with at least one of the program pulses in which the respective bit line of the at least one storage element is floated, a pass voltage is raised on unselected word lines in the set of word lines after the respective bit line starts to float.

26. The method of claim 15, wherein:
the set of storage elements is in a memory array which includes a set of word lines;
a drain select transistor is provided between the at least one storage element and the respective bit line; and
in connection with at least one of the program pulses in which the respective bit line of the at least one storage element is floated, a pass voltage is raised on unselected word lines in the set of word lines, and a gate voltage of the drain select transistor is stepped up after a specified delay relative to when the pass voltage is raised.

27. The method of claim 15, wherein:
a drain select transistor is provided between the at least one storage element and the respective bit line; and
in connection with at least one of the program pulses in which the respective bit line of the at least one storage element is floated, a gate voltage of the drain select transistor is stepped up after the respective bit line starts to float.

28. The method of claim 15, wherein:
a drain select transistor is provided between the at least one storage element and the respective bit line; and
in connection with at least one of the program pulses in which the respective bit line of the at least one storage element is floated, a gate voltage of the drain select transistor is stepped up before the respective bit line starts to float.

29. A storage system, comprising:
a set of storage elements, including at least one storage element which is to be programmed to a target data state;
a respective bit line associated with the at least one storage element; and
one or more control circuits, the one or more control circuits: (a) program the set of storage elements, with the respective bit line grounded, until the at least one storage element reaches a verify level which is below a target verify level of a target data state of the at least one storage element, and (b) in response to the at least one storage element reaching the verify level which is below the target verify level of the target data state of the at least one storage element, continue programming the set of storage elements, with the respective bit line floated.

30. The storage system of claim 29, wherein:
in response to the at least one storage element reaching the verify level which is below the target verify level of the target data state of the at least one storage element, the one or more control circuits continue programming the set of storage elements, with the respective bit line floated after the respective bit line is raised to a level which is associated with a slow programming mode.

31. The storage system of claim 29, wherein:
the verify level which is below the target verify level of the target data state of the at least one storage element, is an offset verify level of the target data state of the at least one storage element.

32. The storage system of claim 29, wherein:
the verify level which is below the target verify level of the target data state, is a target verify level of a lower data state than the target data state of the at least one storage element.

* * * * *